US009986223B2

(12) United States Patent
Goma et al.

(10) Patent No.: US 9,986,223 B2
(45) Date of Patent: *May 29, 2018

(54) FOLDED OPTIC PASSIVE DEPTH SENSING SYSTEM

(71) Applicant: QUALCOMM Incorporated, San Diego, CA (US)

(72) Inventors: Sergiu Radu Goma, San Diego, CA (US); Todor Georgiev Georgiev, Sunnyvale, CA (US); Biay-Cheng Hseih, Irvine, CA (US); Zheng-wu Li, Milipitas, CA (US); Wen-Yu Sun, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/484,637

(22) Filed: Apr. 11, 2017

(65) Prior Publication Data

US 2017/0359566 A1    Dec. 14, 2017

Related U.S. Application Data

(60) Provisional application No. 62/347,529, filed on Jun. 8, 2016, provisional application No. 62/347,542, filed on Jun. 8, 2016.

(51) Int. Cl.
*H04N 13/02* (2006.01)
*G02B 13/02* (2006.01)
(Continued)

(52) U.S. Cl.
CPC ....... *H04N 13/0217* (2013.01); *G02B 3/0043* (2013.01); *G02B 13/02* (2013.01);
(Continued)

(58) Field of Classification Search
None
See application file for complete search history.

(56) References Cited

U.S. PATENT DOCUMENTS 4,844,583 A * 7/1989 Lo .................... G03B 35/10
                                                      359/464
5,671,450 A    9/1997 Suzuki
(Continued)

FOREIGN PATENT DOCUMENTS

WO    WO-2016009942 A1    1/2016

OTHER PUBLICATIONS

International Search Report and Written Opinion—PCT/US2017/028299—ISA/EPO—dated Oct. 10, 2017.
(Continued)

*Primary Examiner* — W B Perkey

(57) ABSTRACT

Certain aspects relate to systems and techniques for folded optic stereoscopic imaging, wherein a number of folded optic paths each direct a different one of a corresponding number of stereoscopic images toward a portion of a single image sensor. Each folded optic path can include a set of optics including a first light folding surface positioned to receive light propagating from a scene along a first optical axis and redirect the light along a second optical axis, a second light folding surface positioned to redirect the light from the second optical axis to a third optical axis, and lens elements positioned along at least the first and second optical axes and including a first subset having telescopic optical characteristics and a second subset lengthening the optical path length. The sensor can be a three-dimensionally stacked backside illuminated sensor wafer and reconfigurable instruction cell array processing wafer that performs depth processing.

30 Claims, 20 Drawing Sheets

(51) Int. Cl.
  *G02B 17/08* (2006.01)
  *G03B 35/10* (2006.01)
  *G02B 3/00* (2006.01)
  *H04N 5/374* (2011.01)
  *H04N 5/376* (2011.01)
  *H04N 5/378* (2011.01)
  *G02B 27/22* (2018.01)
  *H01L 49/00* (2006.01)
  *H04N 5/225* (2006.01)

(52) U.S. Cl.
  CPC ......... *G02B 17/0856* (2013.01); *G02B 27/22* (2013.01); *G03B 35/10* (2013.01); *H01L 49/00* (2013.01); *H04N 5/374* (2013.01); *H04N 5/378* (2013.01); *H04N 5/3765* (2013.01); *H04N 13/0271* (2013.01); *H04N 5/2254* (2013.01); *H04N 2213/001* (2013.01)

(56) References Cited

U.S. PATENT DOCUMENTS

| | | |
|---|---|---|
| 5,835,133 A | 11/1998 | Moreton et al. |
| 2002/0136150 A1 | 9/2002 | Mihara et al. |
| 2003/0048416 A1 | 3/2003 | Meltzer |
| 2005/0088762 A1 | 4/2005 | Ohashi |
| 2005/0185050 A1* | 8/2005 | Ohashi ............... H04N 13/0217 348/50 |
| 2005/0231590 A1 | 10/2005 | Iwasaki |
| 2007/0031134 A1 | 2/2007 | Kuroda et al. |
| 2008/0137218 A1 | 6/2008 | Omichi |
| 2009/0005112 A1 | 1/2009 | Sorek et al. |
| 2009/0244701 A1 | 10/2009 | Gohman |
| 2010/0253832 A1 | 10/2010 | Duparre |
| 2012/0099848 A1 | 4/2012 | Shabtay et al. |
| 2012/0154552 A1 | 6/2012 | Wakazono |
| 2013/0342660 A1* | 12/2013 | Iwasaki ............... H04N 13/0239 348/47 |
| 2014/0146217 A1 | 5/2014 | Morooka |
| 2015/0181089 A1* | 6/2015 | Mirlay ............... G02B 27/1066 348/46 |
| 2015/0253543 A1 | 9/2015 | Mercado |
| 2015/0316748 A1* | 11/2015 | Cheo ..................... G02B 15/16 359/694 |
| 2015/0370059 A1 | 12/2015 | Hoegele et al. |
| 2015/0373263 A1 | 12/2015 | Georgiev et al. |
| 2017/0118421 A1* | 4/2017 | Georgiev ............. H04N 5/3415 |
| 2017/0139184 A1* | 5/2017 | Bae ..................... G02B 13/007 |
| 2017/0230598 A1 | 8/2017 | Takayanagi et al. |
| 2017/0359568 A1 | 12/2017 | Georgiev et al. |

OTHER PUBLICATIONS

Partial International Search Report—PCT/US2017/028299—ISA/EPO—dated Jul. 17, 2017.

* cited by examiner

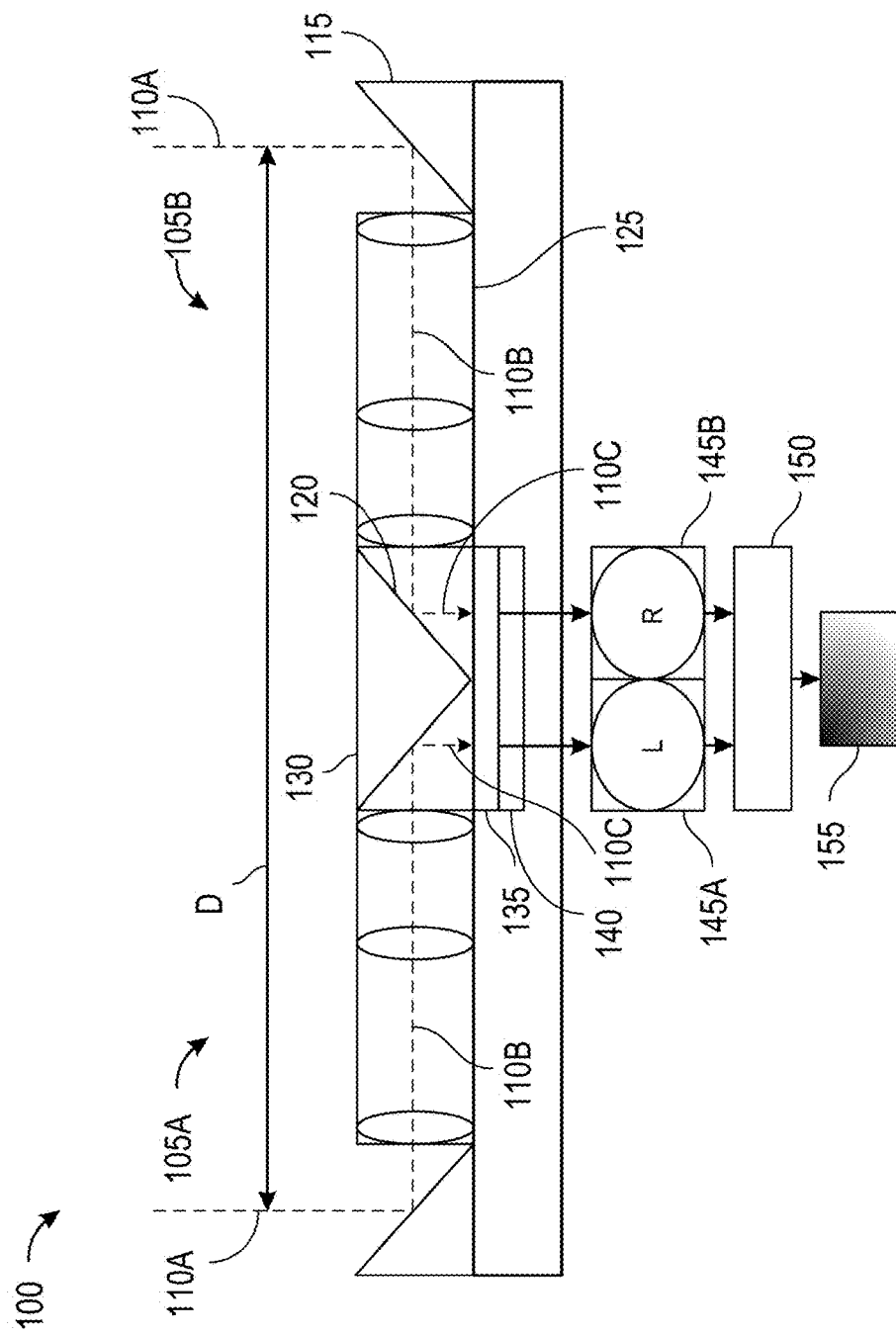

FOLDED OPTIC PASSIVE DEPTH SENSING SYSTEM

CROSS-REFERENCE TO RELATED APPLICATIONS

The present application claims the benefit under 35 U.S.C. § 119(e) of U.S. Provisional Patent Application No. 62/347,529, filed on Jun. 8, 2016, entitled "FOLDED OPTIC PASSIVE DEPTH SENSING SYSTEM," and U.S. Provisional Patent Application No. 62/347,542, filed on Jun. 8, 2016, entitled "WAFER LEVEL OPTICS FOR FOLDED OPTIC PASSIVE DEPTH SENSING SYSTEM," the contents of which is hereby incorporated by reference herein in its entirety and for all purposes.

TECHNICAL FIELD

The systems and methods disclosed herein are directed to stereoscopic imaging, and, more particularly, to folded optic stereoscopic imaging systems.

BACKGROUND

Depth sensing can be accomplished through active or passive depth sensing systems. In active sensing, a known pattern can be projected into a target scene, often referred to as "structured light." The structure of the pattern projected into the target scene encodes depth information for objects in the target scene. To identify depth information, the pattern can be found in a captured image of the target scene and a three-dimensional representation of the target scene can be reconstructed based on the relationship between the known projected pattern and the decoded pattern. Examples of passive depth sensors include stereoscopic imaging systems. In stereoscopic imaging, multiple images of the same target scene are captured from slightly different angles or perspectives. Stereo matching techniques can use disparity between the images to generate a depth map of the target scene.

SUMMARY

One aspect relates to an imaging device having a folded optic path comprising a refractive prism having an input surface, a light folding surface, and an output surface, the light folding surface positioned to redirect light propagating through the input surface along a first optical axis to a second optical axis passing through the output surface; a plastic first lens comprising a first lens surface, the first lens formed in or secured to the input surface; a plastic second lens comprising a second lens surface, the a second lens formed in or secured to the output surface, the first and second lens surfaces collectively having inverted telescopic optical properties to increase the field of view; a first wafer-level optical stack positioned along the second optical axis to receive the light from the plastic second lens, the first wafer-level optical stack comprising a first optical wafer, a third lens surface of a first wafer-level lens secured with an epoxy on a first side of the first optical wafer, and a fourth lens surface of a second wafer-level lens secured with the epoxy on a second side of the first optical wafer; a stop comprising an aperture positioned a predetermined distance from the fourth lens surface to receive the light from the fourth lens surface and pass a portion of the light through the aperture; a second wafer-level optical stack positioned along the second optical axis to receive the light passing through the stop aperture, the second wafer-level optical stack comprising a second optical wafer, a fifth lens surface of a third wafer-level lens secured with the epoxy on a first side of the second optical wafer, and a sixth lens surface of a fourth wafer-level lens secured with the epoxy on a second side of the second optical wafer; a third wafer-level optical stack positioned along the second optical axis to receive the light from the second wafer-level optical stack, the third wafer-level optical stack comprising a third optical wafer, a seventh lens surface of a fifth wafer-level lens secured with the epoxy on a first side of the third optical wafer, and an eighth lens surface of a sixth wafer-level lens secured with the epoxy on a second side of the third optical wafer; a fourth wafer-level optical stack positioned along the second optical axis to receive the light from the third wafer-level optical stack, the fourth wafer-level optical stack comprising a fourth optical wafer, a ninth lens surface of a seventh wafer-level lens secured with the epoxy on a first side of the fourth optical wafer, and a tenth lens surface of an eighth wafer-level lens secured with the epoxy on a second side of the fourth optical wafer; a second light folding surface positioned to receive light from the fourth wafer-level optical stack and redirect light along a third optical axis; and an image sensor positioned to receive light propagating along the third optical axis; wherein the first light folding surface and the second light folding surface are each positioned at an angle of 45° relative to an imaging plane of the image sensor, and wherein the first, second, third, fourth, fifth, sixth, seventh, eighth, ninth, and tenth lens surfaces and the first and second light folding surfaces are fixed in position relative to the image sensor.

Another aspect relates to a stereoscopic imaging system comprising a single image sensor positioned to capture image data representing at least two stereoscopic images of a target scene; at least two folded optic paths comprising optical elements arranged to direct light representing a different one of the at least two stereoscopic images toward a different portion of the single image sensor, each of the at least two folded optic paths comprising a first light folding surface positioned to receive the light representing the one of the at least two stereoscopic images propagating along a first optical axis and redirect the light along a second optical axis, a second light folding surface positioned to receive the light propagating along the second optical axis and redirect the light along a third optical axis, and a plurality of lens elements positioned along at least the first and second optical axis, the plurality of lens elements including a first subset having inverted telescopic optical characteristics for increasing the field of view and a second subset providing focusing and chromatic aberration correction along the optical path length of the folded optic path; wherein the image sensor is positioned to receive the light propagating along the third optical axis of each of the at least two folded optic paths; and wherein the first optical axis of a first of the at least two folded optic paths is separated from the first optical axis of a second of the at least two folded optic paths by a distance of 2-5 cm.

Another aspect relates to an image sensor comprising a first wafer having an array of photosensitive elements and row scanning circuitry, the first wafer comprising a backside illuminated CMOS wafer; a second wafer having column readout circuitry, timing control circuitry, and a reconfigurable instruction cell array image signal processor; and at least one silicon via connecting the first wafer with the second wafer.

Another aspect relates to an image sensor comprising an array of a plurality of photosensitive elements configured to generate electrical signals representing intensity of light incident on the photosensitive elements, the light representing at least two stereoscopic images, a first subset of the plurality of photosensitive elements positioned to capture image data representing a first of the at least two stereoscopic images and a second subset of the plurality of photosensitive elements positioned to capture image data representing a second of the at least two stereoscopic images; and a plurality of microlenses each positioned over a corresponding one of the plurality of photosensitive elements with a center of each microlens shifted by a predetermined shift amount relative to a center of the corresponding one of the plurality of photosensitive elements, a first subset of the plurality of microlenses positioned over the first subset of the plurality of photosensitive elements and a second subset of the plurality of microlenses positioned over the second plurality of photosensitive elements, the predetermined shift amount of the first subset of the plurality of microlenses determined based on a radial distance from a center of the first subset of the plurality of photosensitive elements and the predetermined shift amount of the second subset of the plurality of microlenses determined based on a radial distance from a center of the second subset of the plurality of photosensitive elements.

BRIEF DESCRIPTION OF THE DRAWINGS

The disclosed aspects will hereinafter be described in conjunction with the appended drawings and appendices, provided to illustrate and not to limit the disclosed aspects, wherein like designations denote like elements.

FIG. 1C illustrates one embodiment of a single-sensor stereoscopic imaging system having two folded optic paths.

DETAILED DESCRIPTION

Introduction

In general, this disclosure is related to systems and techniques for simultaneously capturing multiple stereoscopic images with a device that may include only one image sensor, where a number of folded optical paths direct light representing each of the multiple stereoscopic images to different portions of the image sensor. A folded optical path can include one or more light folding elements, for example a reflective surface or a refractive prisms having a reflective surface, as well as lens elements positioned along at least two axes of the folded optical path. The lens elements can be, for example, glass or plastic lenses in various implementations. In some implementations, the lens elements can include wafer-level optical stacks.

Active depth sensing systems can project an infrared (IR) structured light into the target scene. However, the resolution of such systems is limited by the spacing between pattern elements in the target scene, and fine objects such as a finger of a hand cannot be readily discerned. Further, the IR component of sunlight overwhelms the IR pattern if used in bright sunlight, limiting the uses for such systems. These problems, among others, are addressed by the stereoscopic systems disclosed herein, as the stereoscopic systems can resolve small objects down to the size of one pixel and are operable in bright sunlight conditions.

Figure 1A:
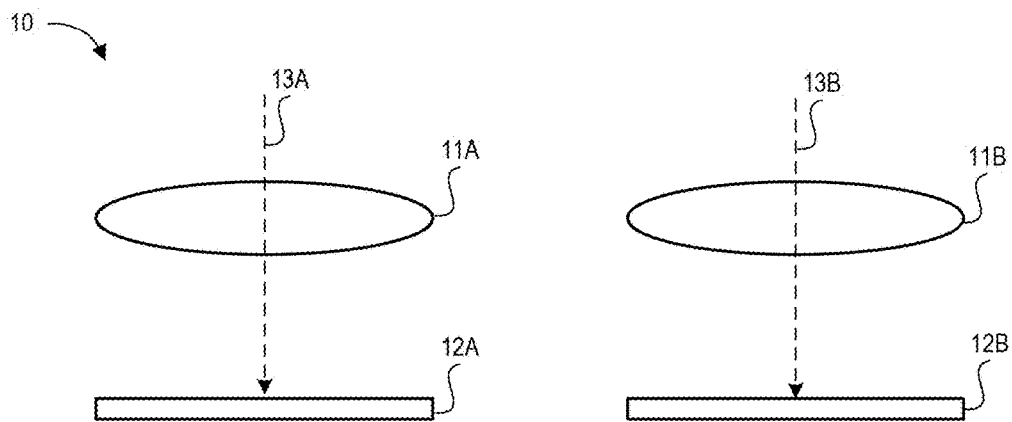
FIGS. 1A and 1B illustrate examples of a prior art stereoscopic imaging systems.

As shown by the example of FIG. 1A, many stereoscopic imaging systems 10 include two image sensors 12A, 12B, with a first sensor 12A for capturing image data representing a left (or top) view of the target scene from a first optical path 13A and a first lens system 11A and a second sensor for capturing image data representing a right (or bottom) view of the target scene from a second optical path 13B and a second lens system 11B. However, the addition of a second imaging sensor comes with some disadvantages. For example, the additional cost of a second imaging sensor and the associated electronics increases cost, can require the device to be somewhat larger than a device with only a single sensor, and also increases the power requirements for supporting both imaging sensors and their associated electronics simultaneously.

Figure 1B:
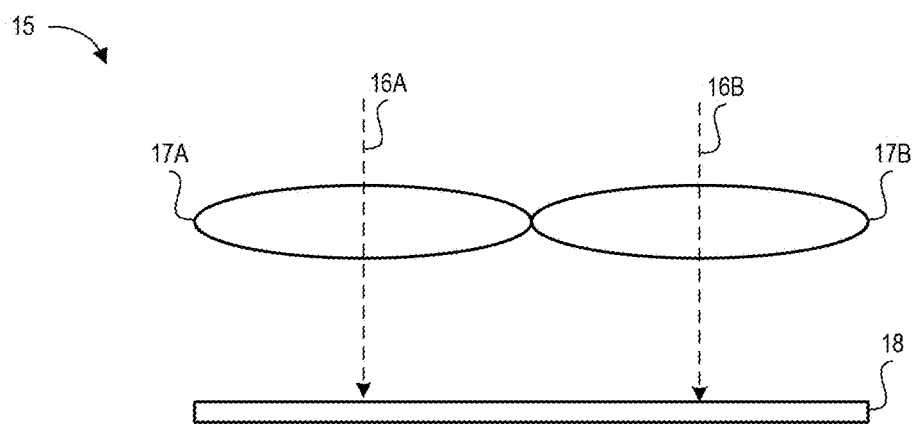

Previous single-sensor stereoscopic systems that capture multiple images simultaneously suffer from drawbacks relating to low disparity, as shown by the example single-sensor stereoscopic system 15 of FIG. 1B. The single-sensor stereoscopic system 15 includes a single sensor 18 that receives light from first and second lens systems 17A, 17B along optical paths 16A, 16B. Due to the adjacent positions of lens systems 17A, 17B, the images incident upon different portions of the sensor 18 come from viewpoints that are separated only by a few millimeters, and thus the disparity between the images (e.g., the distance between optical axes 16A, 16B) is too small to be useful for some depth sensing applications.

The above-identified problems, among others, are addressed in some embodiments by the disclosed single-sensor stereoscopic systems having folded optical paths directing light toward the single sensor. The folding of the optical paths allows the optical axes along which light from the target scene enters the imaging device to be separated by a distance, for example, in some implementations a separation distance of 1 cm, or 2 cm, or up to 5 cm (or more).

Embodiments of the disclosure relate to imaging systems and techniques for simultaneously capturing multiple stereoscopic images with a device that may include only one image sensor. As described above, the use of two image sensors and the associated electronics increases manufacturing and power-usage costs in stereoscopic imaging systems, however single-sensor systems suffer from a low disparity that makes them unsuitable for some depth sensing applications. These problems, among others, are addressed by the folded-optic, single-sensor stereoscopic imaging systems of the present disclosure.

A number of folded optical paths can direct light representing each of the multiple stereoscopic images to different portions of the image sensor. Each folded optical path can include first and second light folding elements, thereby producing an imaging system having a compact height, for example of 4 mm or less. The first and second light folding elements can be reflective mirrors or a reflective surface of a refractive prism in various embodiments, and can be positioned substantially parallel to one another and at a 45° angle relative to an imaging plane of the image sensor. The term "folded" or "folding" as used herein, in the context of a surface or element, refers to a surface or element that redirects light propagating in a first direction to a second direction. For example, by reflection and/or refraction. Each folded optical path can include a first optical axis entering the imaging system from the target scene, a second optical axis whereby light entering the imaging system along the first optical axis is redirected onto the second optical axis by the first light folding element, and a third optical axis whereby light propagating along the second optical axis is incident on the second light folding element and redirected along the third optical axis toward a portion of the image sensor. The first reflective element of each folded optical path can be positioned a distance apart from the first reflective element of each other folded optical path, and the distance can be determined based on a desired disparity between the resulting captured stereoscopic images. The second light folding element of each folded optical path can be positioned adjacent to a portion of the image sensor to direct light onto that adjacent portion of the image sensor, and in some embodiments each second light folding element can be a surface of a mirrored pyramid.

Some embodiments of an imaging system can have an image sensor ("sensor") that includes a 3D stacked wafer having a backside illuminated ("BSI") complementary metal-oxide-semiconductor ("CMOS") sensor wafer stacked with an application-specific integrated circuit ("ASIC") wafer. The ASIC can be a reconfigurable instruction cell array ("RICA") processing engine. The sensor wafer and ASIC wafer can be connected by silicon vias.

A microlens can be provided over each photosensitive element of the sensor. Each photosensitive element can produce a signal corresponding to the intensity of light incident upon it. Chief ray angle ("CRA") refers to the phenomenon where incident light rays passing through the center of a lens aperture will hit the image sensor at different points depending upon their incident angle. CRA typically increases for photosensitive elements at increasing distances from the center of the sensor. For example, a central photosensitive element of the sensor may receive light with a CRA of 0 degrees and peripheral photosensitive elements of the sensor may receive light with CRAs of up to about 25 to 30 degrees. As CRA increases the light that propagates toward a photosensitive element is increasingly blocked, for example by metal traces, resulting in reduced light collection efficiency. To address this issue, microlenses can be shifted by an amount that increases proportional to the center of the sensor, where shift refers to the relative positioning of a center of the microlens to a center of the underlying photosensitive element. This can increase the amount of light captured by the photosensitive elements positioned away from the center of the sensor.

A radial distance of each photosensitive element from a central photosensitive element of the sensor can be calculated, in which the central photosensitive element acts as an origin of an X-Y coordinate. A CRA of each photosensitive element can be determined according to the corresponding radial distance, and the shift of the microlens shift positioned over a photosensitive element can be determined according to the CRA. Each microlens shift can combine an X-axis direction shift with a Y-axis direction shift. In embodiments of the present folded-optic stereoscopic imaging system capturing two images, the microlenses can be formed in two groups, with each group having a shift amount determined based on a center of either a left or right image. A first group of microlenses can be shifted relative to the underlying photosensitive elements based on distance from a center of the left image and a second group of microlenses can be shifted relative to the underlying photosensitive elements based on distance from a center of the right image. Embodiments capturing a set of four images (for example top, bottom, left, and right) usable for determining depth (e.g., four "depth images") using a single sensor can have four sets of microlenses with each set having shifts based on a center of a different one of the four images captured by the sensor. The four images may be two pairs of stereoscopic images. In other embodiments, the height or curvature of the microlenses can be varied based on CRA rather than the center point shift.

As described above, a folded optical path can include first, second, and third optical axes formed by the redirection of light using two reflective surfaces. It will be appreciated that these reflective surfaces can be implemented as standalone reflective surfaces or a reflective surface or backing provided on a refractive prism. As used herein, a "refractive prism" or "prism" refers to a block of refractive optical material where light can pass into the material through an input surface, pass through the material to a light folding surface where the optical path is folded, and pass through the material and out through an output surface. For example, light can enter the prism along the normal of the input face and continue along a path until it hits the back face (light folding surface) of the prism, where total internal reflection occurs because the light strikes the diagonal surface of the prism at for example 45 degrees, or another angle that is greater than the critical angle of refraction of the prism. The light can emerge from the prism along a second normal of the output face of the prism. A folded optic single-sensor stereoscopic system as described herein can include lens elements positioned along at least the first and second axes of each folded optical path. The lens elements can be, for example, glass or plastic lenses in various implementations.

One example optical design having glass and/or plastic lenses can include eight lens surfaces, where a lens surface refers to a curved and/or refractive surface having optical power. For example, in order along the first and second optical axes, first and second lens surfaces can be positioned along the first optical axis and third and fourth lens surfaces can be positioned along the second optical axis. The first, second, third, and fourth lens surfaces can function as an inverted telescopic lens system, whereby the first and second lens surfaces can be considered as an eyepiece lens of a telescope and the third and fourth lens surfaces can be considered as the objective lens of the telescope. The inverted telescopic lens system can increase a field of view of the corresponding sensor portion, for example by doubling the field of view to 60°. In some embodiments, without the inverted telescopic lens system as described herein, each sensor portion can have a field of view of about 30°. A stop or aperture can be positioned a predetermined distance after the fourth lens surface (the output surface of the inverted telescopic lens system) along the second optical axis. Fifth, sixth, seventh, and eighth lens surfaces can be positioned along the second optical axis between the stop and the second reflective surface. The fifth, sixth, seventh, and eighth lens surfaces can provide optical corrections for image sharpness and/or chromatic aberration correction along the optical path, where the optical path length of the second optical axis is selected to achieve a desired disparity between images captured by different sensor portions. The aperture of the system can be approximately 0.5 mm, compared to typical 1.7 mm apertures for such systems, and the focal length can be approximately 1.7 mm, compared to typical 4-5 mm focal length for such systems. The relatively smaller aperture and focal length can result in a long depth of focus, for example such that objects from 0.5 mm to infinity are in focus, thus requiring no focusing motor for images under one megapixel. Accordingly, the described optics can be fixed relative to one another and to the image sensor with no movable focusing lens.

Glass and plastic optics as described above can be more expensive than wafer-level optics for a compact stereoscopic imaging system as described herein. Accordingly, some embodiments can include wafer-level optical stacks. A stack can include a wafer, epoxy on each of two opposing surfaces of the wafer, and a lens secured to each of the two opposing surfaces via the epoxy. The lens surfaces and light folding elements can be affixed to one another using spacer wafers to obtain the desired spacing for the optical design.

Some wafer-level optical designs can include ten lens surfaces. For example, in order along the first and second optical axes, first and second lens surfaces can be positioned along the first optical axis and third, fourth, fifth, sixth, seventh, eighth, ninth, and tenth lens surfaces can be positioned along the second optical axis. The first and second lens surfaces along the first optical axis and the first two of the eight lens surfaces along the second optical axis—the third and fourth lens surfaces—can function as an inverted telescopic lens system, whereby the first and second lens surfaces can be considered as an eyepiece lens of a telescope and the third and fourth lens surfaces can be considered as the objective lens of the telescope. The inverted telescopic lens system can increase a field of view of the corresponding sensor portion, for example by doubling the field of view to 60°. An aperture (or stop) can be positioned between the fourth and fifth lens elements a predetermined distance from the output surface of the inverted telescopic lens system. The fifth, sixth, seventh, eighth, ninth, and tenth lens surfaces can provide optical corrections for image sharpness and/or chromatic aberration correction along the optical path, where the optical path length of the second optical axis is selected to achieve a desired disparity between images captured by different sensor portions. The aperture of the system can be approximately 0.5 mm and the focal length can be approximately 1.7 mm such that objects from 0.5 mm to infinity are in focus, thus requiring no focusing motor for images under one megapixel. Accordingly, the described optics can be fixed relative to one another and to the image sensor with no movable focusing lens.

A hybrid design for the optics can include both plastic optical elements and wafer-level optical elements. One such hybrid design can include ten lens surfaces. For example, in order along the first and second optical axes, a first lens surface can be positioned along the first optical axis and second, third, fourth, fifth, sixth, seventh, eighth, ninth, and tenth lens surfaces can be positioned along the second optical axis. The first lens surface along the first optical axis and the first three of the eight lens surfaces along the second optical axis—the second, third, and fourth lens surfaces—can function as an inverted telescopic lens system, whereby the first and second lens surfaces can be considered as an eyepiece lens of a telescope and the third and fourth lens surfaces can be considered as the objective lens of the telescope. The inverted telescopic lens system can increase a field of view of the corresponding sensor portion, for example by doubling the field of view to 60°. An aperture or stop can be positioned between the fourth and fifth lens elements a predetermined distance from the output surface of the inverted telescopic lens system. The fifth, sixth, seventh, eighth, ninth, and tenth lens surfaces can provide optical corrections for image sharpness and/or chromatic aberration correction along the optical path, where the optical path length of the second optical axis is selected to achieve a desired disparity between images captured by different sensor portions. The first and second lens surfaces can be part of plastic lenses and the first light folding surface can be part of a refractive prism. The plastic lenses can be formed in or bonded to input and output surfaces of the refractive prism with the light folding surface positioned to receive light from the input surface and redirect the received light to the output surface. The third through tenth lens surfaces can be formed as a wafer-level optical stack. The aperture of the system can be approximately 0.5 mm and the focal length can be approximately 1.7 mm such that objects from 0.5 mm to infinity are in focus, thus requiring no focusing motor for images under one megapixel. Accordingly, the described optics can be fixed relative to one another and to the image sensor with no movable focusing lens.

An aperture or stop as described herein is an opaque material having an inner aperture to allow light to pass through the aperture (e.g., the opaque material surrounds the aperture). Some embodiments can be an opaque ring, for example made of plastic. Other embodiments can be an opaque material deposited in a ring on a wafer or lens, for example black chromium. Although the apertures are typically described herein as having a fixed diameter, in variations on the disclosed optical designs adjustable iris apertures can be provided. Further, although the apertures described herein are positioned along the second optical axis a predetermined distance from the output surface of the inverted telescopic lens system, in variations on the disclosed optical designs the positioning of the aperture can be varied, for example to be between the first lens surface and the first light folding element, between the first lens surface and the image sensor, or between the target scene and the first lens surface.

In variations on the disclosed optical designs one or more lenses can be provided along the third optical axis of a folded optical path. Though described in the context of single-sensor stereoscopic systems, the disclosed folded optical paths can be used in multi-sensor stereoscopic systems or in other types of imaging systems.

Various embodiments will be described below in conjunction with the drawings for purposes of illustration. It should be appreciated that many other implementations of the disclosed concepts are possible, and various advantages can be achieved with the disclosed implementations.

Overview of Example Folded Optic Stereoscopic Imaging Systems

FIG. 1C illustrates one embodiment of a single-sensor stereoscopic imaging system 100 having two folded optic paths 105A, 105B. Some embodiments of such a system do not produce standard color images that would be displayed to a user, instead producing a depth map 155 of the target scene. The depth map can be used for a wide variety of applications including combination with black and white, or color, images of the same target scene to produce three-dimensional image data, observation of motion in the target scene for control of a game or other digital application, support of mixed reality applications in which physical and digital objects can interact, and generation of three-dimensional models of imaged objects, to name a few. The robustness of the described system to ambient sunlight makes it suitable for usage outdoors, for example by a hand-carried, vehicle mounted, or a drone-based image capture system. The compact form factor of the described system makes it suitable for use in mobile imaging devices, for example in a smartphone camera system or in another type of portable imaging device.

In the illustrated embodiment, two "folded" optical paths 105A, 105B direct light representing each of the left and right stereoscopic images 145A, 145B to different portions of the image sensor 135. The readout operations of the sensor can be configured to read images captured by different portions in parallel in some embodiments, for example by reading signals from corresponding row and/or columns of sensels across the regions simultaneously, such that the images represent the light propagating from the scene at substantially the same time. Other embodiments can sequentially read signals from different sensor portions. Other embodiments can interleave readout of different sensor portions, for example reading out by row or column of the sensor across all portions that lie along the row or column.

Each folded optical path can include first 115 and second 120 light folding elements, thereby producing an imaging system having a compact height, for example of 4 mm or less. The first and second light folding elements 115, 120 can be reflective mirrors or a reflective surface of a refractive prism in various embodiments, and can be positioned substantially parallel to one another and at a 45° angle relative to an imaging plane of the image sensor 135. Such elements may be referred to herein as "folding" elements, which refers to their property of directing light incident on the folding element from a first direction to a second direction, which may also be referred to as "redirecting" light. Each folded optical path can include a first optical axis 110A entering the imaging system from the target scene, a second optical axis 110B whereby light entering the imaging system along the first optical axis is redirected onto the second optical axis by the first light folding element, and a third optical axis 120 whereby light propagating along the second optical axis is incident on the second light folding element and redirected along the third optical axis toward a portion of the image sensor. The first reflective element 115 of each folded optical path can be positioned a distance apart from the first reflective element of each other folded optical path, and the distance can be determined based on a disparity between the resulting captured stereoscopic images. In other words, the disparity is a result of the different viewpoint of the target scene (or a target object) as light from the target scene enters the imaging system 100 along the two optic paths 105A, 105B. The disparity can correspond to the distance D between the first optical axes 110A of the folded optical paths, and can be 2-5 cm in some embodiments. The second light folding element of each folded optical path can be positioned adjacent to a portion of the image sensor to direct light onto that adjacent portion of the image sensor, and in some embodiments each second light folding element can be a surface of a light folding element 130. In some embodiments, the light folding element 130 has mirrored surfaces that are arranged to receive light from light folding elements 115. In other embodiments, the light folding element is a prism. In some embodiments, the light folding element 130 may be include two or more optical components that together form the light folding element 130. For example, in some embodiments each surface of a light folding element 130 may be part of a separate component that together perform the same function as the pyramid-shaped light folding element 130.

The image sensor can include a 3D stacked wafer having a backside illuminated ("BSI") complementary metal-oxide-semiconductor ("CMOS") sensor wafer 135 stacked with an application-specific integrated circuit ("ASIC") wafer 140. The ASIC can be a reconfigurable instruction cell array ("RICA") processing engine. The sensor wafer and ASIC wafer 140 can be connected by silicon vias. The ASIC wafer can be configured with hardware and/or software for processing 150 the left and right stereoscopic images 145A, 145B to generate the depth map 155. Processing block 150 can represent the functions executed by the ASIC wafer 140 for generating depth map information. The ASIC wafer can be configured with hardware and/or software for processing 150 the left and right stereoscopic images 145A, 145B to correct known distortions of the optics, for example based on pre-calibrated lens data.

Depth map 155 can be generated by identifying a depth value at each of a number of locations in the image and storing the depth values in association with the locations as the depth map. To illustrate, the processing 150 by ASIC wafer 140 can be configured to rectify the depth images to identify an area of overlap. This can be done by analyzing the images or based on a predetermined area of overlap between the fields of view of different sensors or sensor portions. ASIC wafer 140 can also be configured to then perform stereo matching to determine corresponding locations between left and right (or top and bottom) views, for example by feature matching, object recognition, or other suitable techniques. ASIC wafer 140 can further be configured to determine a disparity or offset between the corresponding locations in the images. ASIC wafer 140 can use the disparity to triangulate the depth or distance between the plane of the image sensor and an object depicted at the locations. This depth information can be stored as an image, a point cloud, a matrix, or other suitable formats. In some embodiments other suitable techniques can be applied for determining depth information from the captured images.

An image sensor 135 can comprise, in certain embodiments, a charge-coupled device (CCD), complementary metal oxide semiconductor sensor (CMOS), or any other image sensing device that receives light and generates image data in response to the received image. A sensor can have an array of a plurality of photosensitive elements. The photosensitive elements can be, for example, photodiodes formed in a semiconductor substrate, for example in a CMOS image sensor. The photosensitive element of a CMOS sensor can be one of a depleted p-n junction photodiode or a field-induced depletion region beneath a photogate. As used herein, photosensitive element refers to a single unit of any material, semiconductor, sensor element or other device that converts incident light into current. The individual units or sensing elements of an array of sensors, for example in a CMOS or CCD device, can also be referred to as sensels.

Figure 1E:
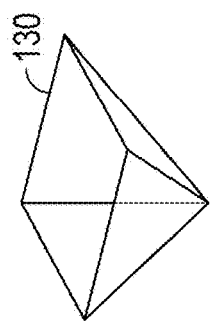
FIG. 1E illustrates a central light folding element that can be used in a single-sensor stereoscopic imaging system having four folded optic paths.
Figure 1D:
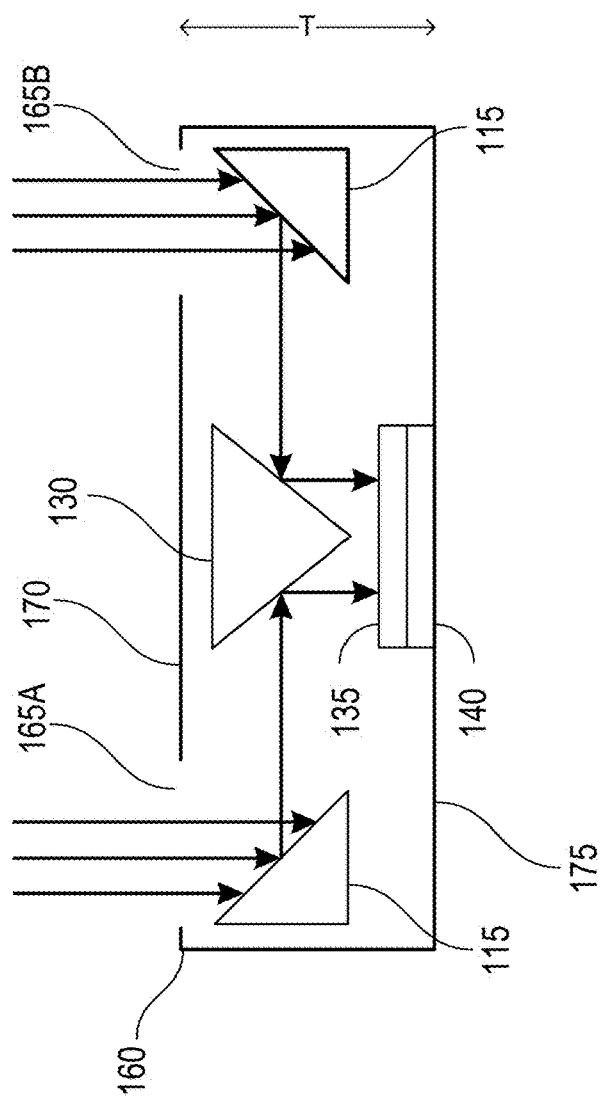
FIG. 1D illustrates the light folding elements and sensor of the system of FIG. 1C.

FIG. 1D illustrates the light folding elements 115, 130 and sensor 135 of the system 100 of FIG. 1C where the mirror pyramid 130 is a four-face mirror prism. FIG. 1D also illustrates that the system 100 having a housing 160. In some embodiments, the housing 160 can enclose the components illustrated in either FIG. 1C (for example the optical components and the sensor) or FIG. 1D (for example, the light folding elements 115, 130, the image sensor 135 and the wafer 140). In some embodiments, the housing 160 includes an upper surface 170 having apertures 165A, 165B and a lower surface 175 aligned parallel to (or substantially parallel to) the upper surface 170 and spaced apart from the upper surface 175 by a thickness T of the housing 160. In some embodiments, the thickness T of the housing can be, for example, 4-8 mm. In some embodiments, the thickness of the housing 160 can be 4 mm, or less. Each aperture 165A, 165B is positioned to allow light to propagate along the first optical axis toward the first reflective element 115 of a folded optic path. Centers of the apertures 165A, 165B can be spaced apart by, for example, 5 cm or more in various embodiments.

FIG. 1E illustrates the mirror prism 130. The four-face mirror prism can be the central light folding element in a single-sensor stereoscopic imaging system having four folded optic paths. Such systems can produce four images usable for determining depth of objects from the sensor ("depth images"), for example two stereoscopic pairs (top/bottom and left/right). As described herein, depth images can be a set of two or more images having sufficient disparity for the imaging system to determine depth or distance of objects from the sensor using the depth images. In variations on the described folded-optic stereoscopic systems more or less faces can be provided for a central pyramid with a corresponding number of folded optical paths to generate a corresponding number of images for depth information generation. Multiple such folded-optic stereoscopic systems can be used together in some embodiments.

Figure 2A:
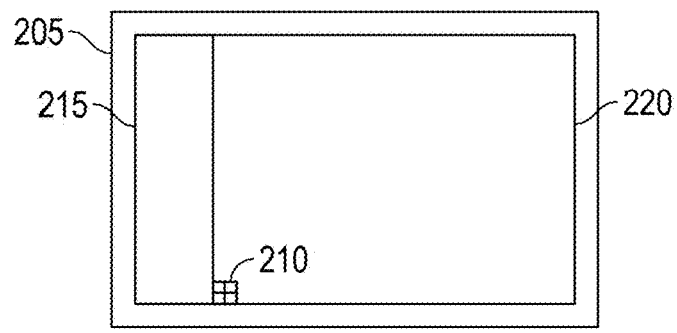
FIGS. 2A-2C illustrate an example image sensor architecture.
Figure 2B:
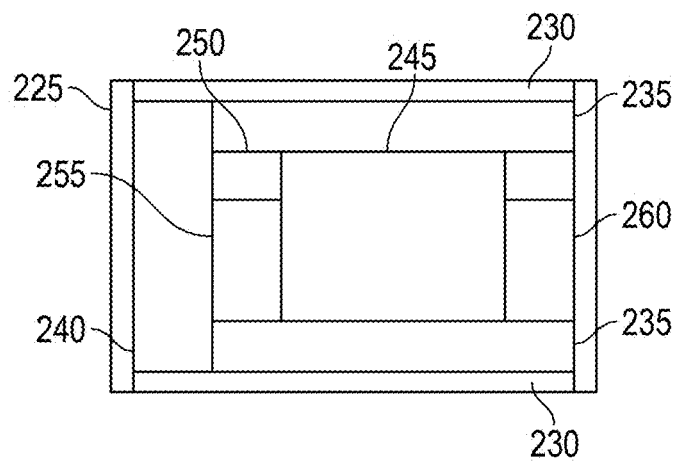
Figure 2C:
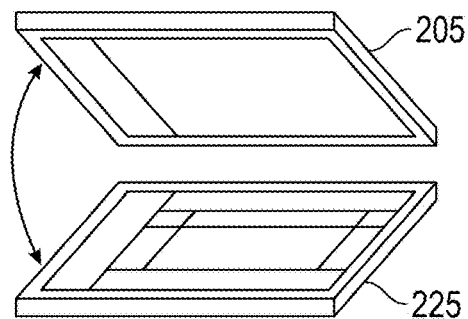

FIGS. 2A-2C illustrate an example of an embodiment of an image sensor architecture 200. FIG. 2A illustrates an example sensor wafer 205 having row scanning circuitry 215 and a photosensitive detector array 220 comprising a plurality of sensels 210, though for purposes of clarity only one sensel 210 is shown. Sensor wafer 205 can be a silicon wafer or other thin substrate of photosensitive material. A sensel can include at least a photodetector region of the sensor wafer 205 and a microlens positioned over the photodetector region. The illustrated sensel 210 is depicted as including one of four color filters of a color filter array arranged according to the standard Bayer color filter pattern, though it will be appreciated that the color filter array can be modified depending on the color sensing requirements of the system, and that some embodiments of the disclosed depth systems may include different bandpass or wavelength blocking filters and/or no color filter array. In one example, the image sensor architecture 200 can be implemented as the single sensor shown in FIGS. 1C and 1D, and the detector array 220 can have a number sensing portions each positioned to capture an image from one of a number of folded optic paths. The microlenses of each portion can be shifted based on a center location of that portion, as described with respect to FIGS. 10A and 10B. Thus, though not illustrated in FIG. 2A, the image sensor architecture 200 can include a number of microlenses each positioned above a corresponding sensel.

The sensor wafer 205 can be a BSI CMOS sensor wafer in some embodiments. The BSI image sensor may have a structure attached thereto to provide support for the BSI image sensor, which may have a lower structural integrity due to manufacturing and design constraints (e.g., due to the BSI image sensor having to be very thin to allow for light to penetrate to the silicon substrate, the BSI image sensor wafer may be fragile and susceptible to damage). In some embodiments, the structure supporting the BSI image sensor wafer may be a "dummy" or "blank" silicon wafer; accordingly, the components placed in the ASIC wafer 225 may be integrated into the support wafer used to provide structural support for the BSI image sensor.

FIG. 2B illustrates an ASIC wafer 225 that can be used with the sensor wafer 205 of FIG. 2A. The ASIC wafer 225 can include I/O pad ring 230, column readout circuitry 235, digital block/timing control circuitry 240, and a reconfigurable instruction cell array ("RICA") processing engine 245, among other depicted features. A RICA includes an array of customizable instruction cells (ICs) that can be dynamically reconfigured, and the reconfigurable core of a RICA has ICs to deal with execution flow control. Accordingly, a RICA processing engine does not require coupling with a general purpose processor as it can provide similar features. As such, the RICA processing engine 245 is a configurable processor architecture. Features of a RICA an architecture includes less power consumption when compared to leading VLIW and low-power digital signal processors, while still maintaining a high throughput performance. An ASIC wafer having a RICA region as shown in FIG. 2B can be referred to herein as a RICA wafer. The ASIC wafer 225 can also include a PLL region 250, bias/ref gen region 255, and sensor IF region 260. It will be appreciated that the specific layout shown for the regions of the ASIC wafer 225 provides one example of a suitable layout, and that the described functionalities may be accomplished using a variety of layouts.

As shown in FIG. 2C, the image sensor wafer 205 and ASIC wafer 225 can form a 3D stack 200. The sensor wafer and ASIC wafer can be connected to communicate signals by silicon vias (not shown). The ASIC wafer can be configured with hardware and/or software for processing the stereoscopic images to generate the depth information and thus does not require a standard image signal processor or host device processor to perform these features. The ASIC wafer can be configured with hardware and/or software for processing the stereoscopic images to correct known distortions of the optics, for example based on pre-calibrated lens data. The ASIC wafer having RICA processing capabilities stacked together with the CMOS BSI sensor can provide an inexpensive and fast solution while also meeting the form factor constraints of the disclosed systems, supporting high resolution imaging, and saving power over traditional image signal processor (ISP) based processing.

Figure 3A:
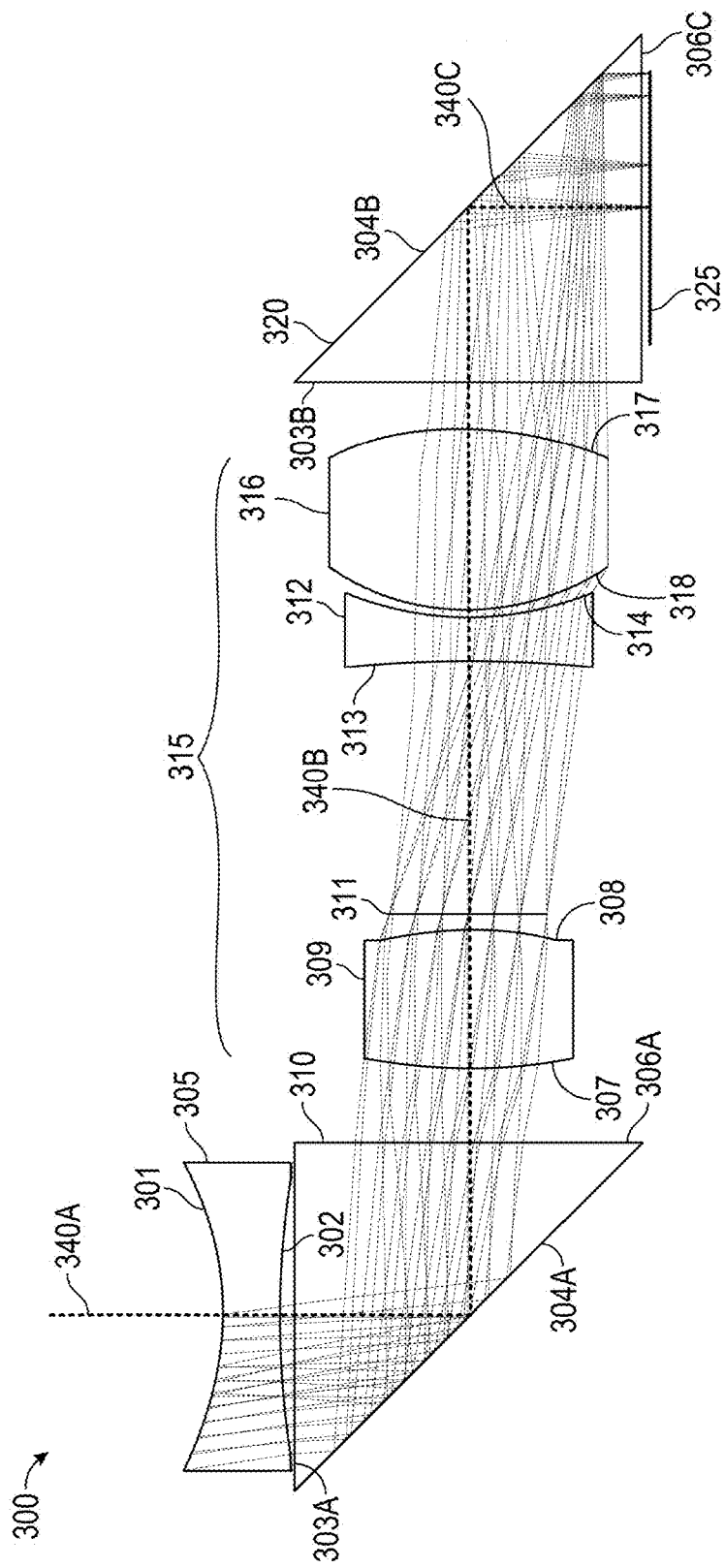
FIG. 3A illustrates optical elements of an example folded optic path design having refractive prism light folding elements.

Overview of Example Plastic/Glass Optics for Folded Optic Stereoscopic Imaging Systems FIG. 3A illustrates optical elements that are arranged to form an example of an embodiment of a folded optic path 300. The folded optic path 300 can receive light, and propagate light through the optical elements, directing the lights path of propagation. The folded optic path 300 includes refractive prism light folding elements 310, 320. The lens elements 305, 309, 312, 316 of FIG. 3A can include glass and/or plastic lenses. As illustrated, in order along the first and second optical axes, a first lens surface 301 and a second lens surface 302 of a first lens 305 can be positioned along the first optical axis 340A. A group 315 of lenses can be positioned along second optical axis 340B between the output surface 306A of prism 310 and the input surface 303B of prism 320.

Third lens surface 307 and a fourth lens surface 308 (first lens 309 of group 315) can be positioned along the second optical axis 340B between the light folding prisms 310, 320. Light folding prisms 310, 320 can each have an input surface 303a, 303b, a light folding surface 304A, 304B, and an output surface 306a, 306b. The light folding surface 304A, 304B can be a reflective surface, for example a mirror coating or film applied to the prism 310, 320 in some embodiments. Light folding surface 304A can fold a first optical axis 340A of light entering through the input surface 303A approximately 90 degrees to a second optical axis 340B of light exiting the prism 310 through the output surface 306A. Light folding surface 304B can fold second optical axis 340B of light entering through the input surface 303B approximately 90 degrees to a third optical axis 340C of light exiting the prism 320 through the output surface 306B.

The first lens surface 301, second lens surface 302, third lens surface 307, and fourth lens surface 308 can function as an inverted telescopic lens system, whereby the first and second lens surfaces can be considered as an eyepiece lens of a telescope and the third and fourth lens surfaces can be considered as the objective lens of the telescope, to increase a field of view of the corresponding sensor portion, for example by doubling the field of view to 60°. Various embodiments of the folded optic path 300 may include a stop 311 (or aperture 311) which is represented by the vertical line depicted in grouping 315. The stop 311 can be positioned a predetermined distance after the fourth lens surface (the output surface of the inverted telescopic lens system) along the second optical axis 340B. Third lens 312 including fifth lens surface 313 and sixth lens surface 314 and the fourth lens 316 including seventh lens surface 318 and eighth lens surface 317 can be positioned along the second optical axis between the stop and the second prism 320. The second lens group includes fifth, sixth, seventh, and eighth lens surfaces 313, 314, 318, 317 that can provide optical corrections for image sharpness and/or chromatic aberration correction. With respect to the chromatic aberration corrections, without such corrections the camera represented by the folded optic path 300 may only focus a small range of wavelengths of light. By providing chromatic aberration corrections via the second lens group, the camera can capture in-focus images from an expanded range of wavelengths of light. The design of the fifth, sixth, seventh, and eighth lens surfaces 313, 314, 318, 317 can be selected to provide such corrections along the desired length of the second optical axis 340B.

The aperture 311 of the system can be approximately 0.5 mm and the focal length can be approximately 1.7 mm. This can result in a long depth of focus, for example such that objects from 0.5 mm to infinity are in focus, thus requiring no focusing motor for images under one megapixel. Accordingly, the described optics can be fixed relative to one another and to the image sensor with no movable focusing lens. In various embodiments the aperture 311 can be a fixed size opening or can be an adjustable iris.

Figure 3B:
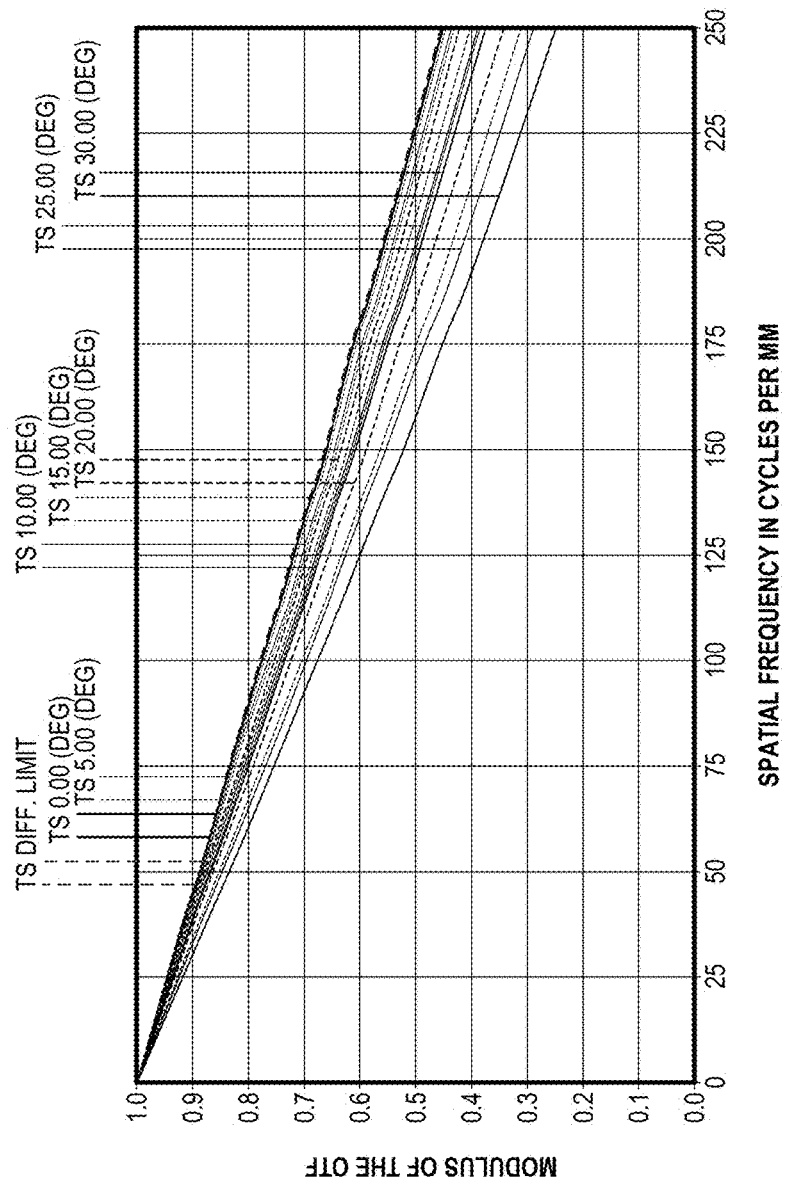
FIG. 3B illustrates MTF performance of the optical elements of FIG. 3A.

FIG. 3B illustrates MTF performance of the optical elements of FIG. 3A.

Figure 4A:
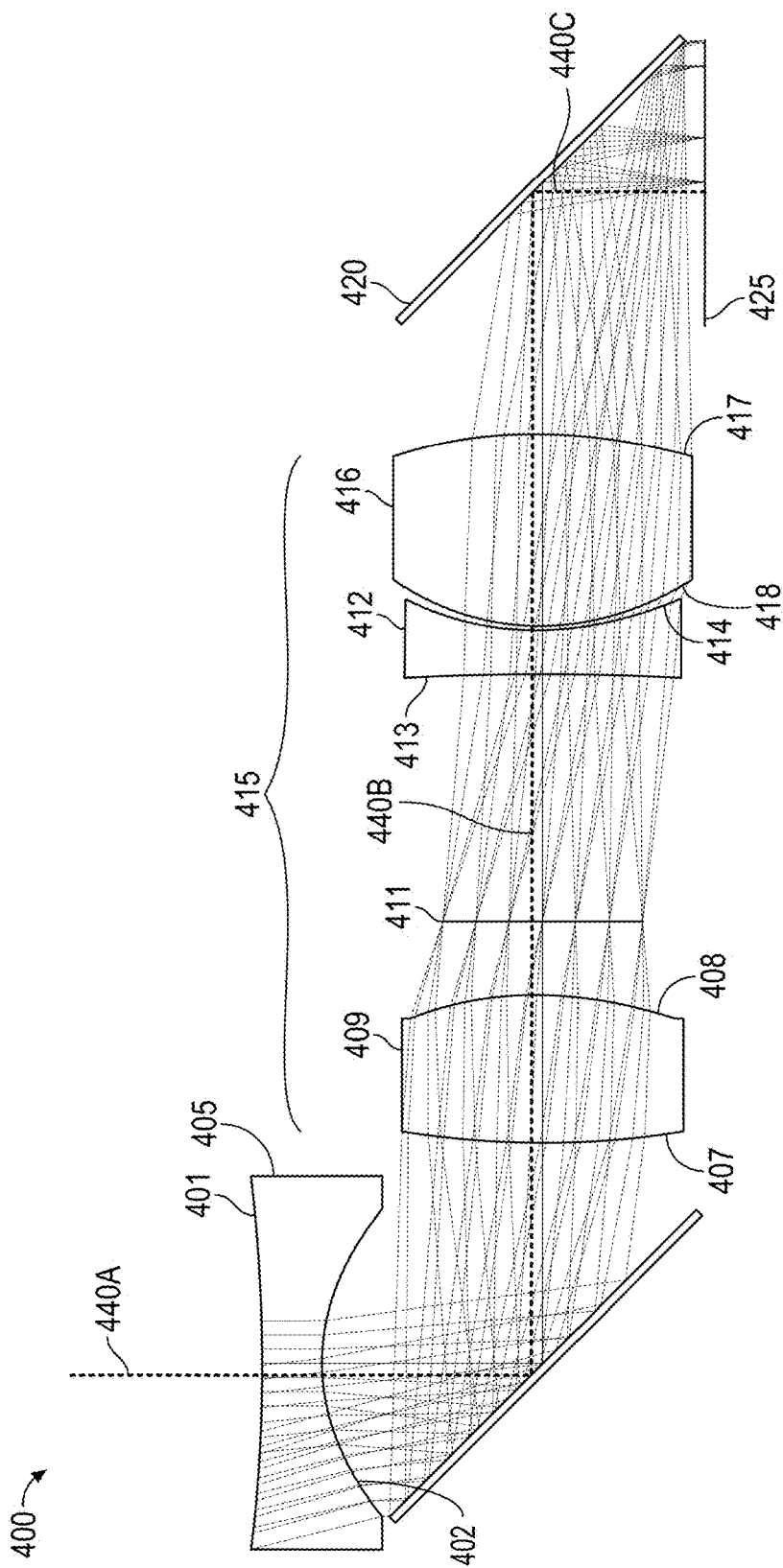
FIG. 4A illustrates optical elements of an example folded optic path design having reflective surface light folding elements.

FIG. 4A illustrates optical elements of an example folded optic path 400 having reflective surfaces 410, 420 as light folding elements. The lens elements 405, 409, 412, 416 of FIG. 4A can be glass and/or plastic lenses. As illustrated, in order along the first and second optical axes, first lens surface 401 and second lens surface 402 of first lens 405 can be positioned along the first optical axis 440A. A group 415 of lenses can be positioned along second optical axis 440B between the reflective surfaces 410, 420. A third lens surface 407 and fourth lens surface 408 of second lens can be positioned along the second optical axis 440B between reflective surface 410 and aperture stop 411. The first, second, third, and fourth lens surfaces can function as an inverted telescopic lens system, whereby the first and second lens surfaces can be considered as an eyepiece lens of a telescope and the third and fourth lens surfaces can be considered as the objective lens of the telescope, to increase a field of view of the corresponding sensor portion, for example by doubling the field of view to 60°.

A stop or aperture 411 (the diameter of which is represented by the vertical line in FIG. 4A) can be positioned a predetermined distance after the fourth lens surface 408 (the output surface of the inverted telescopic lens system) along the second optical axis 440B. The aperture 411 can be approximately 0.5 mm and the focal length can be approximately 1.7 mm. This can result in a long depth of focus, for example such that objects from 0.5 mm to infinity are in focus, thus requiring no focusing motor for images under one megapixel. Accordingly, the described optics can be fixed relative to one another and to the image sensor with no movable focusing lens. In various embodiments the aperture 411 can be a fixed size opening or can be an adjustable iris.

Third lens 412 including fifth lens surface 413 and sixth lens surface 414 and fourth lens 416 including seventh lens surface 418 and eighth lens surface 417 can be positioned along the second optical axis between the stop and the second reflective surface 420. The fifth, sixth, seventh, and eighth lens surfaces can provide optical corrections of the light, for example, they may (singly or in combination) provide for image sharpness, distortion, and/or chromatic aberration correction.

Figure 4B:
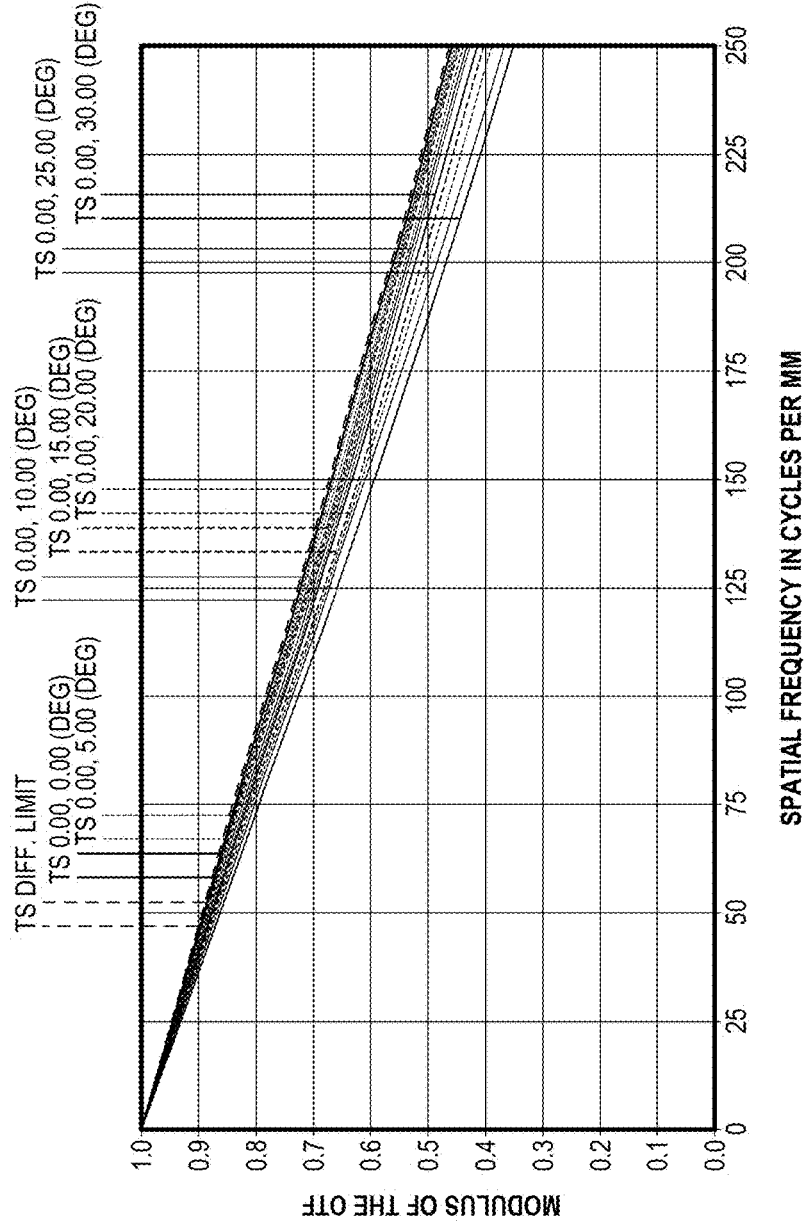
FIG. 4B illustrates MTF performance of the optical elements of FIG. 4A.

FIG. 4B illustrates MTF performance of the optical elements of FIG. 4A. As evident from the comparison of FIGS. 3B and 4B, the design of FIG. 4A including reflective mirrors without refractive prisms has improved performance compared to the design of FIG. 3A.

The plastic/glass optics of FIGS. 3A-4B can be suitable for use with visible light ranging from 480 nm to 650 nm in some embodiments.

Overview of Example Wafer-Level Optics for Folded Optic Stereoscopic Imaging Systems Glass and plastic optics as described above can be more expensive than wafer-level optics for a compact stereoscopic imaging system as described herein. Accordingly, some embodiments can include wafer-level optical stacks. A stack can include a wafer, epoxy on each of two opposing surfaces of the wafer, and a lens secured to each of the two opposing surfaces via the epoxy. The lens surfaces and light folding elements can be affixed to one another using spacer wafers to obtain the desired spacing for the optical design. Compared to the plastic/glass lens designs, some embodiments of wafer level optics can be suitable for use with approximately double the range of wavelengths, for example from 400 nm-800 nm.

The designs of FIGS. 5A-5B and 7A-7B described below are specific to the disclosed epoxy, and for varying epoxies the design can be modified according to the optical differences between the epoxies.

Figure 5A:
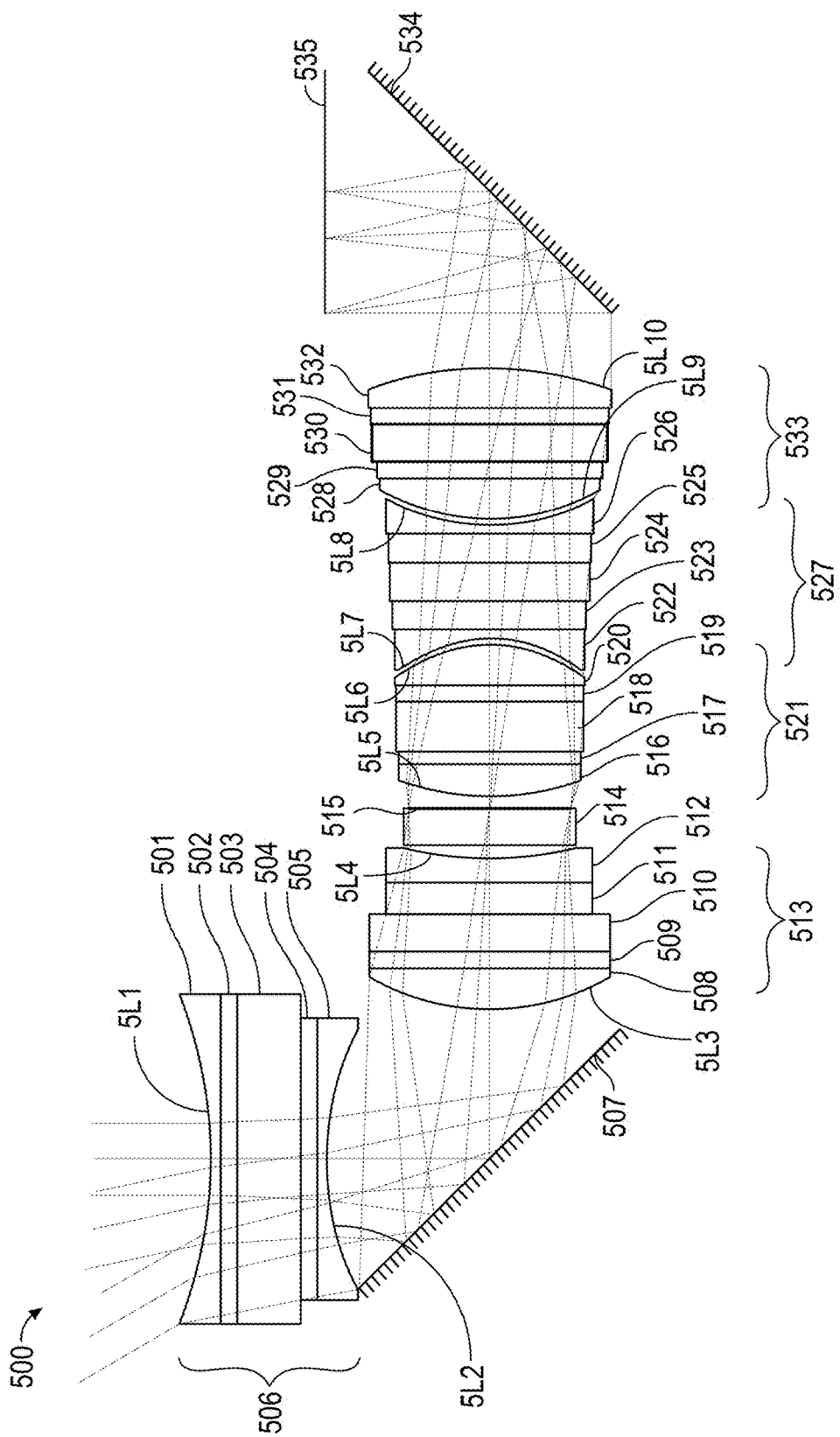
FIGS. 5A-5B illustrate wafer-level optical elements of an example folded optic path design.
Figure 5B:
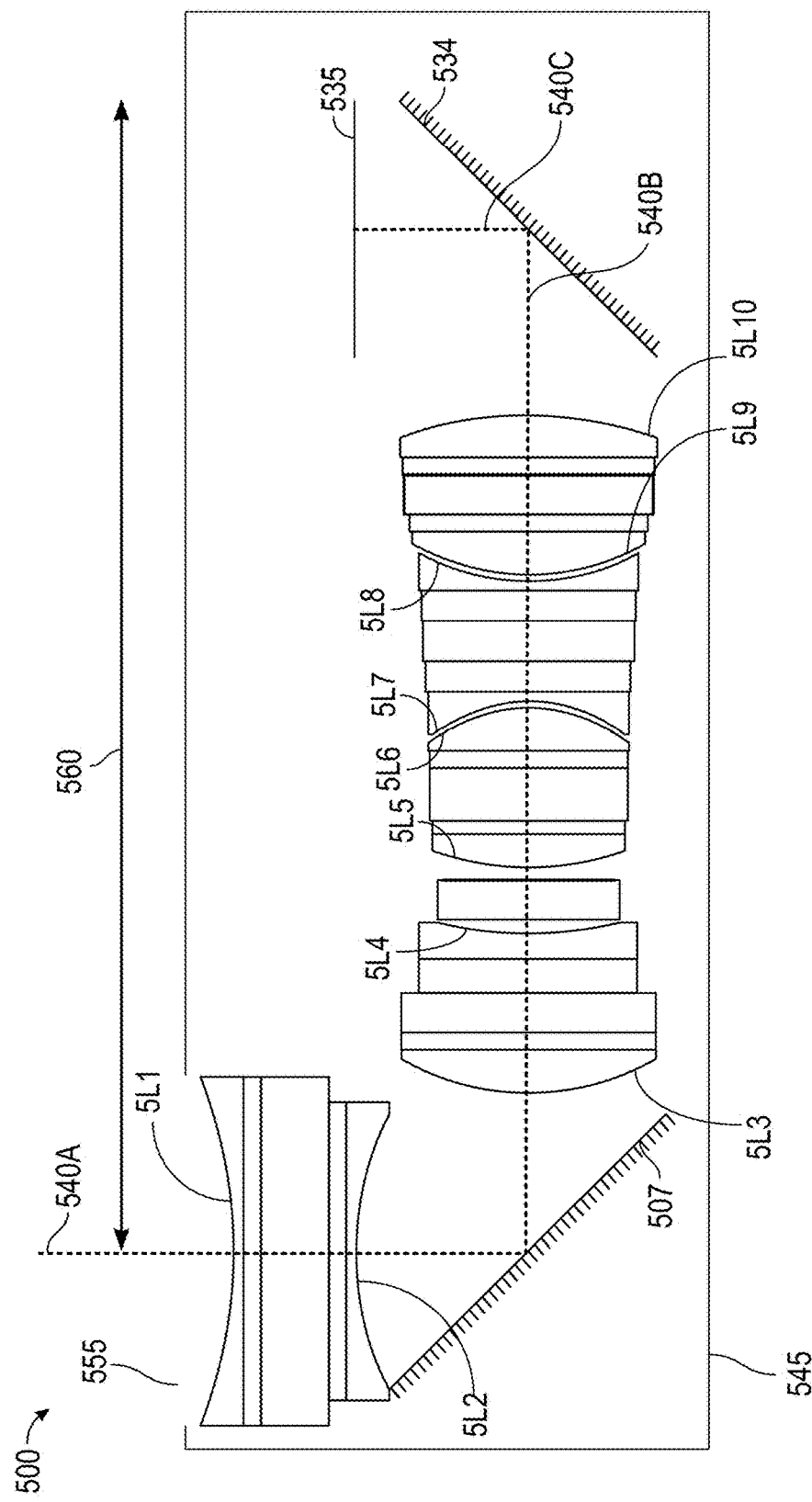

FIGS. 5A-5B illustrate wafer-level optical elements of an example folded optic path 500. As discussed above, the sensor 535 shown for the folded optic path 500 can be one light sensing portion of a sensor having multiple light sensing portions. FIG. 5A illustrates an example ray trace and stop position for with the ten lens surfaces 5L1-5L10 and reflective light folding surfaces 507, 534 of this design. FIG. 5B illustrates the folded optical axes 540A-540C of the folded optic path design of FIG. 5A and also illustrates an example housing for the optical elements of the folded optic path. As illustrated, first reflective surface 507 redirects or folds the path of light propagating along first optical axis 540A approximately 90 degrees onto the second optical axis 540B and the second reflective surface 534 redirects or folds the path of light propagating along second optical axis 540B approximately 90 degrees onto the third optical axis 540C. It will be appreciated that the second light folding element 534 of FIGS. 5A-5B can be rotated 90 degrees and thus positioned to direct light in the opposite direction, as shown in FIGS. 1C and 1D, and that the positioning of sensor 535 can be changed accordingly. It will be appreciated that some or all lens surfaces 5L1-5L10 can be aspheric.

The optical elements of the folded optic path 500 can be formed into a number of wafer-level optical stacks 506, 513, 521, 527, 533 as described in more detail below. A wafer-level optical stack can be manufactured by stacking and bonding wafers having optical components using alignment and bonding techniques similar to semiconductor manufacturing. For example, a transparent wafer having a number of lenses, also referred to as a lens plate, may be provided first. The lenses of this first lens plate can be positioned in a grid or matrix across at least one surface of the lens plate. A spacer wafer of a transparent substrate may be provided between the first lens plate and a second lens plate having a corresponding number of lenses to provide a desired distance between the lens surfaces of the first and second lens plates. In some examples a stress buffer layer can be disposed between the spacer wafer and a lens plate to buffer a stress effect between the lens plate and the spacer wafer, thereby decreasing defects cause by the stress effect. The size, optical properties, and material of the buffer layer can be part of the optical design of the stack. The buffers shown in FIGS. 5A-5B and 7A-7B can comprise a transparent material. In certain embodiments, transparent wafers may be polyethylene terephthalate ("PET"), polyethylene naphthalate ("PEN"), cellulose acetate ("TAC"), cycloaliphatic hydrocarbons ("COP"), bi-axially-oriented polypropylene ("BOPP"), polyester, polycarbonate, glass, or combinations thereof, and the composition of transparent wafers may vary based on an application or design. The first and second lens plates and spacer wafer can be aligned, bonded (for example by UV bonding, adhesives, or other suitable methods), and then the stacked wafers diced into individual wafer-level optical stacks.

The wafer-level optical design of FIGS. 5A-5B can include ten lens surfaces 5L1-5L10. For example, in order along the first optical axis 540A, a first lens surface 5L1 and a second lens surface 5L2 can be positioned along the first optical axis 540A. A first lens 501 includes first lens surface 5L1 and a second lens 505 includes second lens surface 5L2.

As illustrated, the lenses of FIGS. 5A-5B can be a single-sided lens comprising a piece of optical material having a first side shaped with a desired curvature and a second, flat side opposite the first side. The first lens 501 can be bonded to a first side of a first spacer wafer 503 with first buffer 502 disposed between the and first single-sided lens 501 and the first spacer wafer 503. The second lens 505 can be bonded to a second side of the first spacer wafer 503 opposing the first side with second buffer 504 disposed between the and second single-sided lens 505 and the first spacer wafer 503. Thus, the first lens 501, first buffer 502, first spacer wafer 503, second buffer 504, and second lens 505 form first wafer-level optical stack 506.

In order along the second optical axis 540B, a third lens surface 5L3, fourth lens surface 5L4, fifth lens surface 5L5, sixth lens surface 5L6, seventh lens surface 5L7, eighth lens surface 5L8, ninth lens surface 5L9, and tenth lens surface 5L10 can be positioned along the second optical axis 540B. A second wafer-level optical stack 513 includes third lens 508, third buffer 509, second spacer wafer 510, fourth buffer 511, and fourth lens 512. A third wafer-level optical stack 521 includes fifth lens 516, fifth buffer 517, third spacer wafer 518, sixth buffer 519, and sixth lens 520. A fourth wafer-level optical stack 527 includes seventh lens 522, seventh buffer 523, fourth spacer wafer 524, eighth buffer 525, and eighth lens 526. A fifth wafer-level optical stack 533 includes ninth lens 528, ninth buffer 529, fourth spacer wafer 530, tenth buffer 531, and tenth lens 532.

The first lens surface 5L1 and second lens surface 5L2 along the first optical axis 540A and the first two of the eight lens surfaces along the second optical axis 540B—the third lens surface 5L3 and fourth lens surface 5L4—can function as an inverted telescopic lens system, whereby the first lens surface 5L1 and second lens surface 5L2 can be considered as an eyepiece lens of a telescope and the third lens surface 5L3 and fourth lens surface 5L4 can be considered as the objective lens of the telescope. The inverted telescopic lens system 506, 513 can increase a field of view of the corresponding sensor 535 or sensor portion, for example by doubling the field of view to 60°.

The second lens group including fifth lens surface 5L5, sixth lens surface 5L6, seventh lens surface 5L7, eighth lens surface 5L8, ninth lens surface 5L9, and tenth lens surface 5L10 can provide optical corrections for image sharpness and/or chromatic aberration correction along the length of the second optical axis 540B. As described above, having increased disparity between the images can be beneficial for producing depth data using the images. As such, the optical path 500 can be designed such that the second optical axis 540B extending between the first reflective surface 507 and the second reflective surface 534 has a length of 2.5 cm (or more). The design of the second lens group can factor in the length of the second optical axis 540B (or a portion thereof, for example extending between stop 515 and the second reflective surface 534) to determine lens parameters (curvature, materials, and the like) for providing the desired optical and chromatic aberration corrections.

An aperture or stop 515 can be positioned between the fourth and fifth lens elements a predetermined distance from the output surface of the inverted telescopic lens system 506, 514. The line in FIG. 5A shown by reference number 515 will be understood to be the opening of the aperture. In various embodiments the aperture 515 can be a fixed size opening, for example formed as a non-reflective material applied to a surface of spacer wafer 514, or can be an adjustable iris provided adjacent to the surface of the spacer wafer 514. The spacer wafer 514 can be 0.4 mm thick in some examples to provide for 0.4 mm of separation between the edge of fourth lens surface 5L4 and the aperture 515. The spacer wafer 514 can be made from HIMAX glass. In one example, the aperture 515 of the system can be approximately 0.5 mm and the focal length can be approximately 1.7 mm such that objects from 0.5 mm to infinity are in focus, thus requiring no focusing motor for images less than one megapixel. Accordingly, the described optical elements of folded optic path 500 can be fixed relative to one another and to the image sensor with no movable focusing lens.

Though not illustrated, in variations on the disclosed design one or more lens surfaces can be positioned along the third optical axis 540C between the second reflective surface 534 and the sensor 535.

Example dimensions and materials for one embodiment of the optical elements for folded optic path 500 will now be described. Referring to the first wafer-level optical stack 506, the first lens 501, first buffer 502, second buffer 504, and second lens 505 can be HIMAX UV1 material and the first spacer wafer 503 can be 0.5 mm thick HIMAX glass. First lens 501 can have a center thickness of 0.07 mm and an edge thickness of 0.325 mm, first buffer 502 can have a center thickness of 0.13 mm and an edge thickness of 0.13 mm, second buffer 504 can have a center thickness of 0.13 mm and an edge thickness of 0.13 mm, and second lens 505 can have a center thickness of 0.07 mm and an edge thickness of 0.328 mm. Surface 5L1 of the first lens 501 can have a radius of −2.271 mm and surface 5L2 of the second lens 505 can have a radius of 2.525 mm.

Referring to the second wafer-level optical stack 513, the third lens 508, third buffer 509, fourth buffer 511, and fourth lens 512 can be HIMAX UV2 material and the second spacer wafer 510 can be 0.3 mm thick HIMAX glass. Third lens 508 can have a center thickness of 0.325 mm and an edge thickness of 0.074 mm, third buffer 509 can have a center thickness of 0.125 mm and an edge thickness of 0.125 mm, fourth buffer 511 can have a center thickness of 0.25 mm and an edge thickness of 0.25 mm, and fourth lens 512 can have a center thickness of 0.2 mm and an edge thickness of 0.278 mm. Surface 5L3 of the third lens 508 can have a radius of 2.158 mm and surface 5L4 of the fourth lens 512 can have a radius of −4.256 mm.

Referring to the third wafer-level optical stack 521, the fifth lens 516, fifth buffer 517, sixth buffer 519, and sixth lens 520 can be HIMAX UV1 material and the third spacer wafer 518 can be 0.4 mm thick HIMAX glass. Fifth lens 516 can have a center thickness of 0.25 mm and an edge thickness of 0.129 mm, fifth buffer 517 can have a center thickness of 0.1 mm and an edge thickness of 0.1 mm, sixth buffer 519 can have a center thickness of 0.125 mm and an edge thickness of 0.125 mm, and sixth lens 520 can have a center thickness of 0.325 mm and an edge thickness of 0.065 mm. Surface 5L5 of the fifth lens 516 can have a radius of −2.124 mm and surface 5L6 of the sixth lens 520 can have a radius of 1.180 mm.

Referring to the fourth wafer-level optical stack 527, the seventh lens 522, seventh buffer 523, eighth buffer 525, and eighth lens 526 can be HIMAX UV2 material and the fourth spacer wafer 524 can be 0.3 mm thick HIMAX glass. Seventh lens 522 can have a center thickness of 0.07 mm and an edge thickness of 0.325 mm, seventh buffer 523 can have a center thickness of 0.23 mm and an edge thickness of 0.23 mm, eighth buffer 525 can have a center thickness of 0.23 mm and an edge thickness of 0.23 mm, and eighth lens 526 can have a center thickness of 0.07 mm and an edge thickness of 0.285 mm. Surface 5L7 of the seventh lens 522 can have a radius of 1.088 mm and surface 5L8 of the eighth lens 526 can have a radius of −2.705 mm.

Referring to the fifth wafer-level optical stack 533, the ninth lens 528, ninth buffer 529, tenth buffer 531, and tenth lens 532 can be HIMAX UV1 material and the fourth spacer wafer 530 can be 0.3 mm thick HIMAX glass. Ninth lens 528 can have a center thickness of 0.07 mm and an edge thickness of 0.325 mm, ninth buffer 529 can have a center thickness of 0.23 mm and an edge thickness of 0.23 mm, tenth buffer 531 can have a center thickness of 0.23 mm and an edge thickness of 0.23 mm, and tenth lens 532 can have a center thickness of 0.07 mm and an edge thickness of 0.285 mm. Surface 5L9 of the ninth lens 528 can have a radius of −3.245 mm and surface 5L10 of the tenth lens 532 can have a radius of 2.124 mm.

As shown in FIG. 5B, in one embodiment the optical elements positioned along the second optical axis 540B and the third optical axis 540C can be enclosed or contained within a camera housing 545 having an aperture 555 positioned to allow light to propagate along the first optical axis 540A toward the first reflective surface 507. The camera housing can include upper surface having the aperture 555 and a lower surface parallel to and spaced apart by a thickness of the housing from the upper surface. The thickness can be 3.42 mm or less in some embodiments. In another embodiment, the first reflective surface 507, second wafer-level optical stack 516, third wafer-level optical stack 521, wafer 514 and stop 515, fourth wafer-level optical stack 527, fifth wafer-level optical stack 533, sixth wafer-level optical stack 533, second reflective surface 534, and sensor 535 are contained between the upper and lower surfaces of the housing 545 and the first wafer-level optical stack 506 is provided within a lens casing secured to the exterior of the housing 545 over the aperture 555. The length and/or width of camera housing 545 can be extended horizontally to include other folded optic paths and sensor portions in a depth sensing system implementing a number of other folded optic paths 500.

In some embodiments, a length 560 between the first optical axis 540A and an edge of second reflective surface 534 disposed furthest from the first optical axis 540A can be between 1 cm and 2.5 cm. This can provide, for example, a desired disparity of 2 cm and 5 cm between images when folded optic path 500 is used in a system having an additional folded optic path of the illustrated configuration but positioned mirrored relative to folded optic path 500 such that the sensor areas are adjacent. The sensor areas can be portions of the same sensor wafer as described above.

Figure 6A:
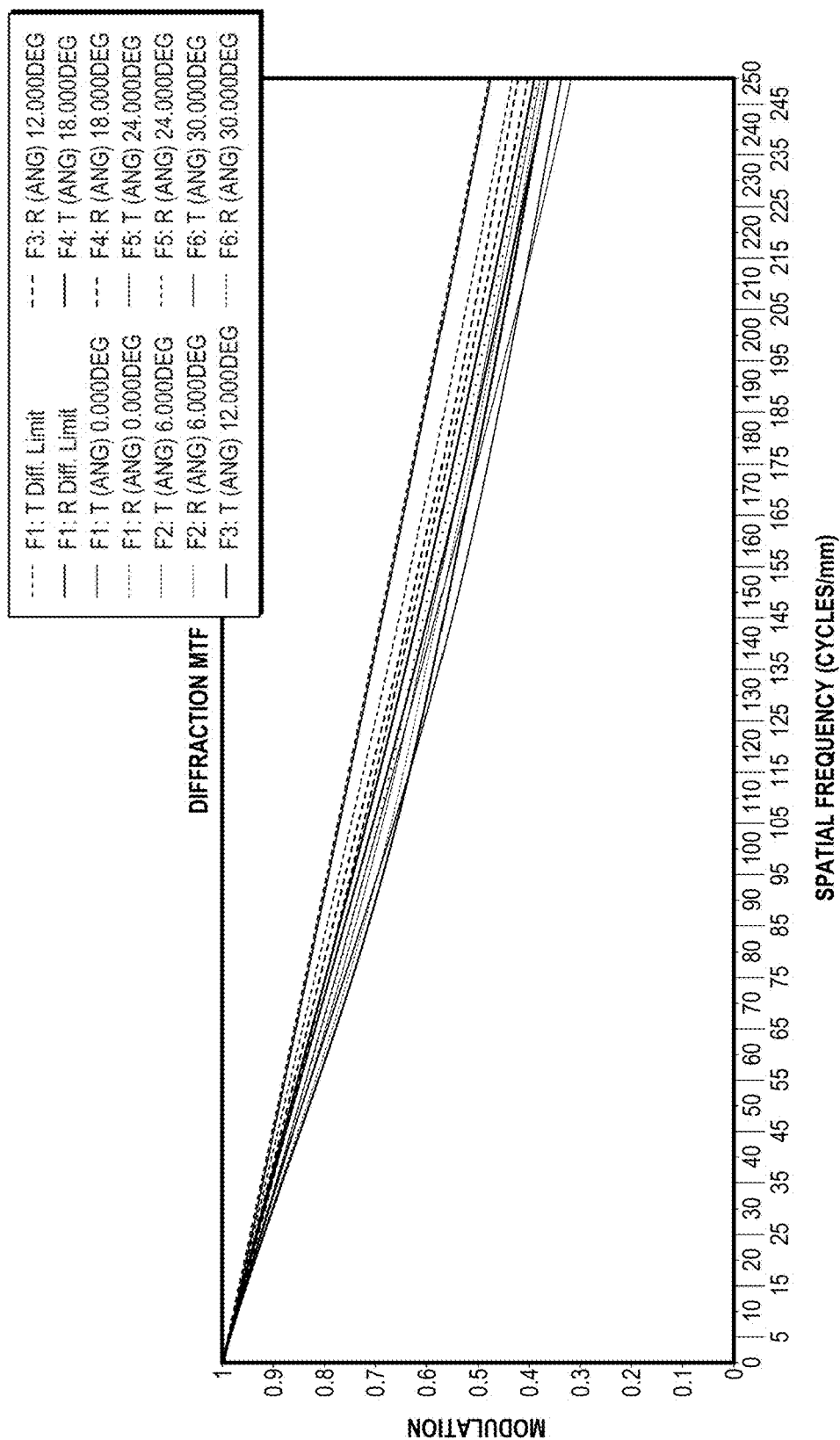
FIG. 6A illustrates diffraction MTF of the wafer-level optical elements of FIGS. 5A-5B.
Figure 6B:
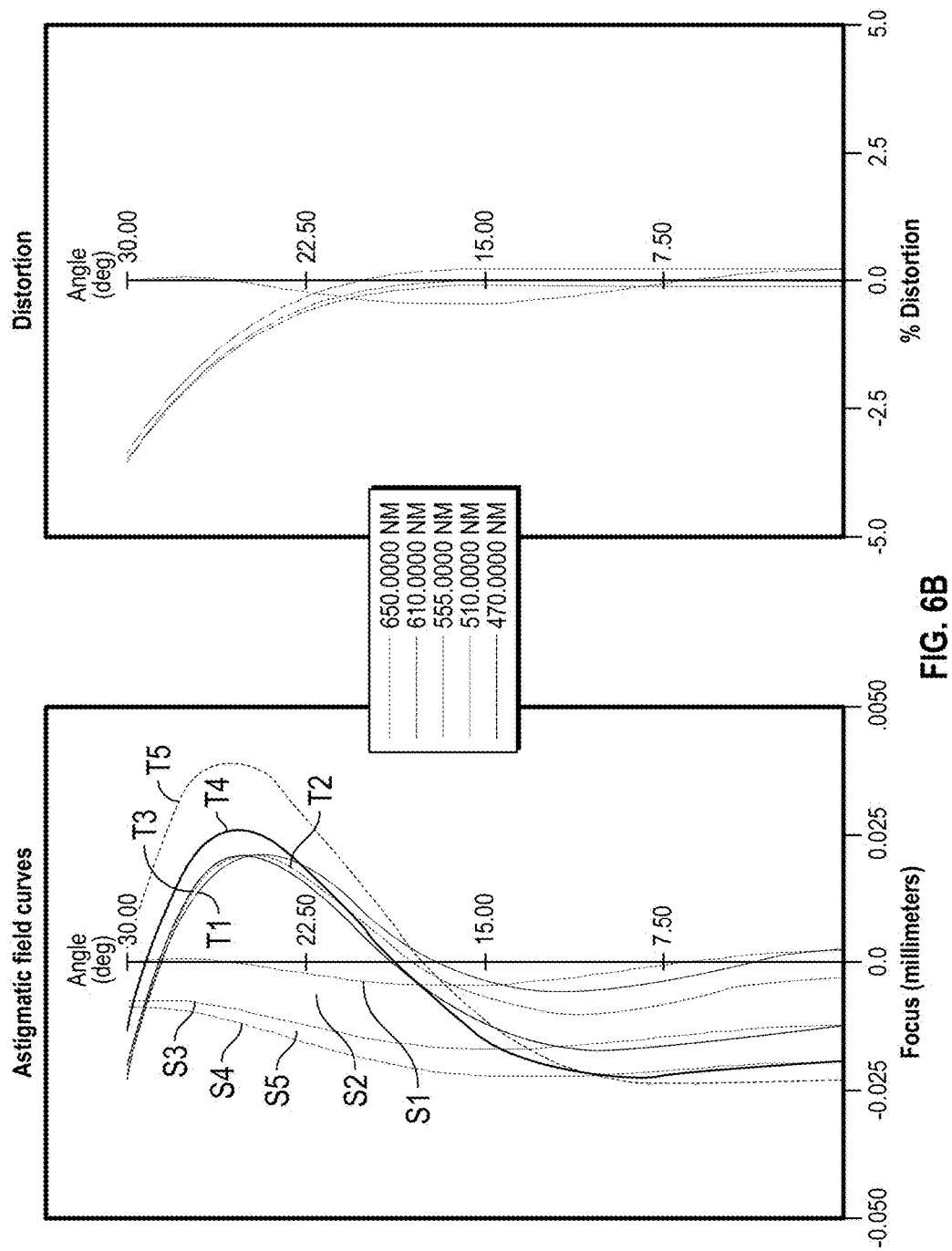
FIG. 6B illustrates astigmatic field curves and distortion of the wafer-level optical elements of FIGS. 5A-5B at a number of wavelengths.

FIG. 6A illustrates diffraction MTF of the wafer-level optical elements of FIGS. 5A-5D. FIG. 6B illustrates astigmatic field curves and distortion of the wafer-level optical elements of FIGS. 5A-5D at a number of wavelengths. As shown by FIG. 6B, the design of FIGS. 5A-5D may result in distortions in the captured image data. Rather than increasing the acuity of the optical design, which may increase expense, the disclosed systems can computationally compensate for the known distortion, for example through hardware and/or software implemented on the sensor ASIC.

Figure 7A:
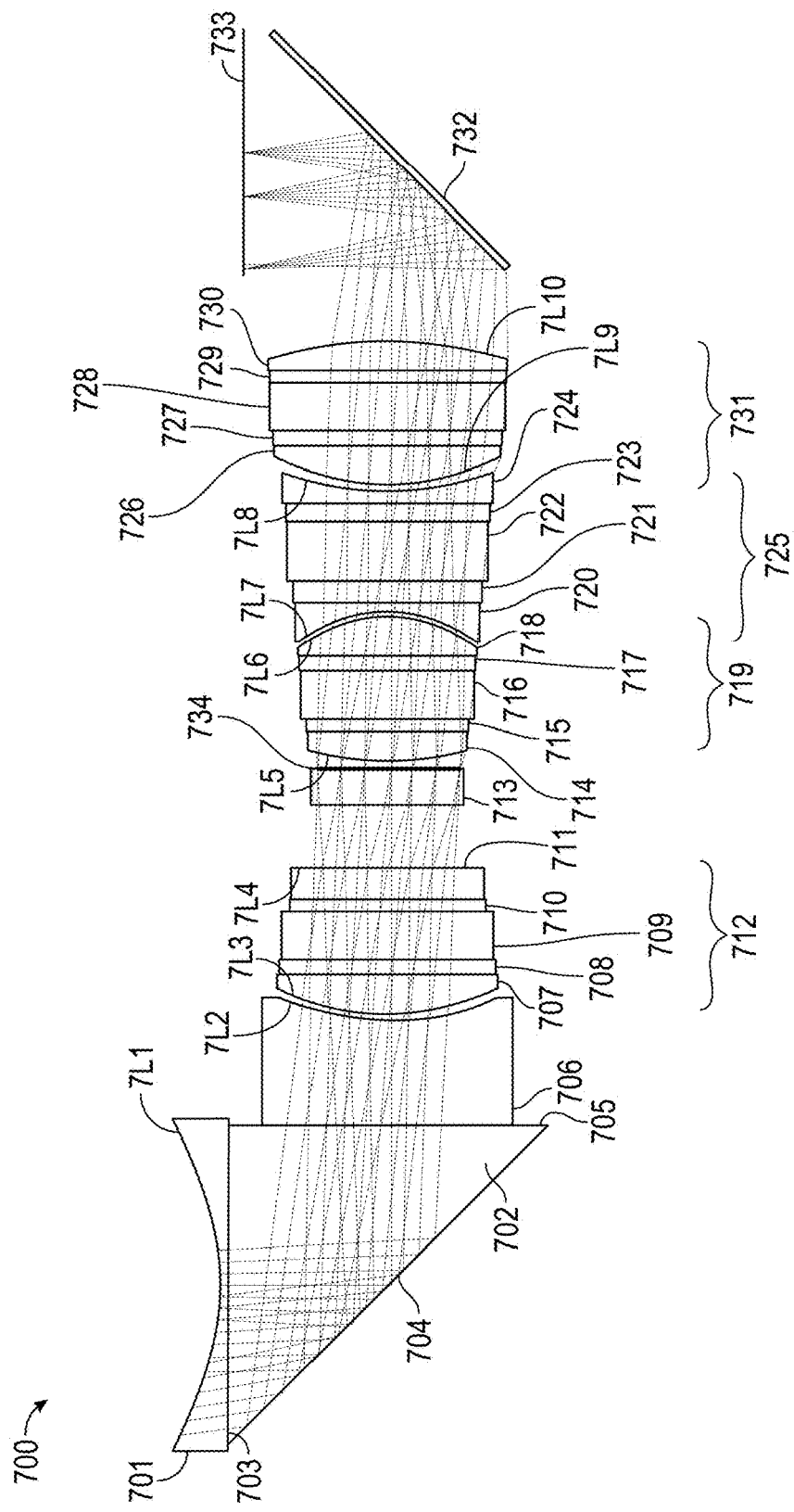
FIGS. 7A-7B illustrate an example folded optic path design having a mix (also referred to as a "hybrid") of plastic optical elements and wafer-level optical elements.
Figure 7B:
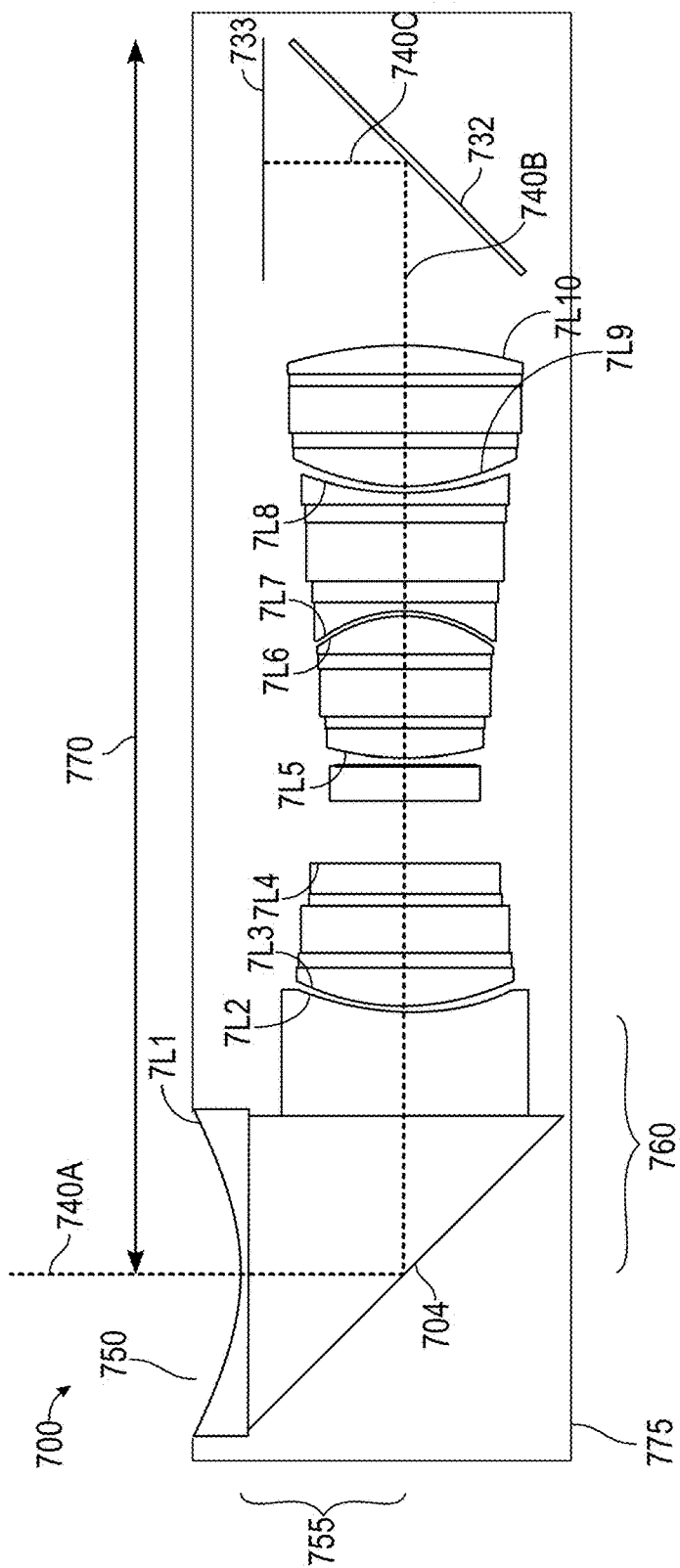

FIGS. 7A-7B illustrate an example folded optic path 700 having a mix of plastic optical elements and wafer-level optical elements. As discussed above, the sensor 733 shown for the folded optic path 700 can be one light sensing portion of a sensor having multiple light sensing portions. FIG. 7A illustrates an example ray trace and stop position for with the ten lens surfaces 7L1-7L10 and light folding elements 702, 732 of this hybrid design. FIG. 7B illustrates the folded optical axes 740A-740C of the folded optic path design of FIG. 7A and also illustrates an example housing for the optical elements of the folded optic path. As illustrated, first reflective surface 704 of optical prism 702 redirects or folds the path of light propagating along first optical axis 740A approximately 90 degrees onto the second optical axis 740B and the second reflective surface 732 redirects or folds the path of light propagating along second optical axis 740B approximately 90 degrees onto the third optical axis 740C. It will be appreciated that the second reflective surface 732 of FIGS. 7A-7B can be positioned to direct light in the opposite direction, as shown in FIGS. 1C and 1D. It will be appreciated that some or all lens surfaces 7L1-7L10 can be aspheric.

A hybrid design as shown in FIGS. 7A-7B can include both plastic optical elements and wafer-level optical elements and can include ten lens surfaces 7L1-7L10. For example, a first lens surface 7L1 can be positioned along the first optical axis 740A and a second lens surface 7L2, third lens surface 7L3, fourth lens surface 7L4, fifth lens surface 7L5, sixth lens surface 7L6, seventh lens surface 7L7, eighth lens surface 7L8, ninth lens surface 7L9, and tenth lens surface 7L10 can be positioned along the second optical axis 740B.

First lens 701 including the first lens surface 7L1 and the second lens 706 including second lens surface 7L2 can be plastic lenses and the first reflective surface 704 can be part of optical prism 702, for example a plastic refractive prism. First lens 701 can be formed in or bonded to input surface 703 of optical prism 702 and second lens 706 can be formed in or bonded to output surface 705 of optical prism 702. Reflective surface 704 can positioned to receive light from the input surface 703 and redirect the received light to the output surface 705 and can be a reflective coating or backing applied to the surface of the prism.

The third through tenth lens surfaces can be formed as a number of wafer-level optical stacks. First wafer-level optical stack 712 includes third lens 707, first buffer 708, first spacer wafer 709, second buffer 710, and fourth lens 711. Second wafer-level optical stack 719 includes fifth lens 714, third buffer 715, second spacer wafer 716, fourth buffer 717, and sixth lens 718. Third wafer-level optical stack 725 includes seventh lens 720, fifth buffer 721, third spacer wafer 722, sixth buffer 723, and eighth lens 724. Fourth wafer-level optical stack 731 includes ninth lens 726, seventh buffer 727, fourth spacer wafer 728, eighth buffer 729, and tenth lens 730.

The first lens surface 7L1 along the first optical axis 740A and the first three of the eight lens surfaces along the second optical axis 740B—the second lens surface 7L2, third lens surface 7L3, and fourth lens surface 7L4—can function as an inverted telescopic lens system, whereby the first lens surface 7L1 and second lens surface 7L2 can be considered as an eyepiece lens of a telescope and the third lens surface 7L3 and the fourth lens surface 7L4 can be considered as the objective lens of the telescope. The inverted telescopic lens system 701, 706, 712 can increase a field of view of the corresponding sensor portion, for example by doubling the field of view to 60°.

The second group including fifth lens surface 7L5, sixth lens surface 7L6, seventh lens surface 7L7, eighth lens surface 7L8, ninth lens surface 7L9, and tenth lens surfaces lens surface 7L10 can be positioned along at least a portion of the length of the second optical axis 740B and can provide optical corrections for image sharpness and/or chromatic aberration correction.

An aperture or stop 734 can be positioned between the fourth lens surface 7L4 and fifth lens surface 7L5 a predetermined distance from the output surface of the inverted telescopic lens system. The line in FIG. 7A shown by reference number 734 will be understood to be the opening of the aperture. In various embodiments the aperture 734 can be a fixed size opening, for example formed as a non-reflective material applied to a surface of spacer wafer 713, or can be an adjustable iris provided adjacent to the surface of the spacer wafer 713. The spacer wafer 713 can be 0.3 mm thick in some examples. The spacer wafer 713 can be made from HIMAX glass. The aperture 734 can be approximately 0.5 mm and the focal length can be approximately 1.7 mm such that objects from 0.5 mm to infinity are in focus, thus requiring no focusing motor for images under one megapixel. Accordingly, the described optical elements of folded optic path 700 can be fixed relative to one another and to the image sensor with no movable focusing lens.

Though not illustrated, in variations on the disclosed design one or more lens surfaces can be positioned along the third optical axis 740C between the second reflective surface 732 and the sensor 733.

Example dimensions and materials for one embodiment of the optical elements for folded optic path 700 will now be described. First lens 701, optical prism 702, and second lens 706 can be ZENOR F52R or another suitable optical plastic. A distance along the first optical axis 740A between center of first lens 701 and the first reflective surface 704 can be 1.4 mm. A distance along the second optical axis 740B between the first reflective surface 704 and center of second lens 706 can be 2.2 mm. Surface 7L1 of the first lens 701 can have a radius of −1.764 mm and surface 7L2 of the second lens 706 can have a radius of −1.992 mm.

Referring to the first wafer-level optical stack 712, the third lens 707, first buffer 708, second buffer 710, and fourth lens 711 can be HIMAX UV2 material and the first spacer wafer 709 can be 0.4 mm thick HIMAX glass. Third lens 707 can have a center thickness of 0.325 mm and an edge thickness of 0.112 mm, first buffer 708 can have a center thickness of 0.125 mm and an edge thickness of 0.125 mm, second buffer 710 can have a center thickness of 0.1 mm and an edge thickness of 0.1 mm, and fourth lens 711 can have a center thickness of 0.250 mm and an edge thickness of 0.263 mm. Surface 7L3 of the third lens 707 can have a radius of −1.617 mm and surface 7L4 of the fourth lens 711 can have a radius of −6.981 mm.

Referring to the second wafer-level optical stack 719, the fifth lens 714, third buffer 715, fourth buffer 717, and sixth lens 718 can be HIMAX UV1 material and the second spacer wafer 716 can be 0.4 mm thick HIMAX glass. Fifth lens 714 can have a center thickness of 0.25 mm and an edge thickness of 0.161 mm, third buffer 715 can have a center thickness of 0.1 mm and an edge thickness of 0.1 mm, fourth buffer 717 can have a center thickness of 0.125 mm and an edge thickness of 0.125 mm, and sixth lens 718 can have a center thickness of 0.325 mm and an edge thickness of 0.066 mm. Surface 7L5 of the fifth lens 714 can have a radius of −1.952 mm and surface 7L6 of the sixth lens 718 can have a radius of 1.223 mm.

Referring to the third wafer-level optical stack 725, the seventh lens 720, fifth buffer 721, sixth buffer 723, and eighth lens 724 can be HIMAX UV2 material and the third spacer wafer 722 can be 0.5 mm thick HIMAX glass. Seventh lens 720 can have a center thickness of 0.07 mm and an edge thickness of 0.325 mm, fifth buffer 721 can have a center thickness of 0.18 mm and an edge thickness of 0.18 mm, sixth buffer 723 can have a center thickness of 0.15 mm and an edge thickness of 0.15 mm, and eighth lens 724 can have a center thickness of 0.1 mm and an edge thickness of 0.254 mm. Surface 7L7 of the seventh lens 720 can have a radius of 1.146 mm and surface 7L4 of the eighth lens 724 can have a radius of −2.005 mm.

Referring to the fourth wafer-level optical stack 731, the ninth lens 726, seventh buffer 727, eighth buffer 729, and tenth lens 730 can be HIMAX UV1 material and the fourth spacer wafer 728 can be 0.4 mm thick HIMAX glass. Ninth lens 726 can have a center thickness of 0.325 mm and an edge thickness of 0.0884 mm, seventh buffer 727 can have a center thickness of 0.125 mm and an edge thickness of 0.125 mm, eighth buffer 729 can have a center thickness of 0.1 mm and an edge thickness of 0.1 mm, and tenth lens 730 can have a center thickness of 0.25 mm and an edge thickness of 0.094 mm. Surface 7L9 of the ninth lens 726 can have a radius of −1.766 mm and surface 7L10 of the tenth lens 730 can have a radius of 2.117 mm.

As shown in FIG. 7B, in one embodiment the optical elements of folded optic path 700 can be enclosed or contained within a camera housing 775 having an aperture 750 positioned to allow light to propagate along the first optical axis 740A toward the first lens 701. The camera housing can include upper surface having the aperture 750 and a lower surface parallel to and spaced apart by a thickness of the housing from the upper surface. The thickness can be 3.2 mm or less in some embodiments. The length and/or width of camera housing 745 can be expanded to include other folded optic paths and sensor portions in a depth sensing system implementing a number of other folded optic paths 700.

In some embodiments, a length 770 between the first optical axis 740A and an edge of second reflective surface 732 disposed furthest from the first optical axis 740A can be between 1 cm and 2.5 cm. This can provide, for example, a desired disparity of 2 cm and 5 cm between images when folded optic path 700 is used in a system having an additional folded optic path of the illustrated configuration but positioned mirrored relative to folded optic path 700 such that the sensor areas are adjacent. The sensor areas can be portions of the same sensor wafer as described above.

Figure 8A:
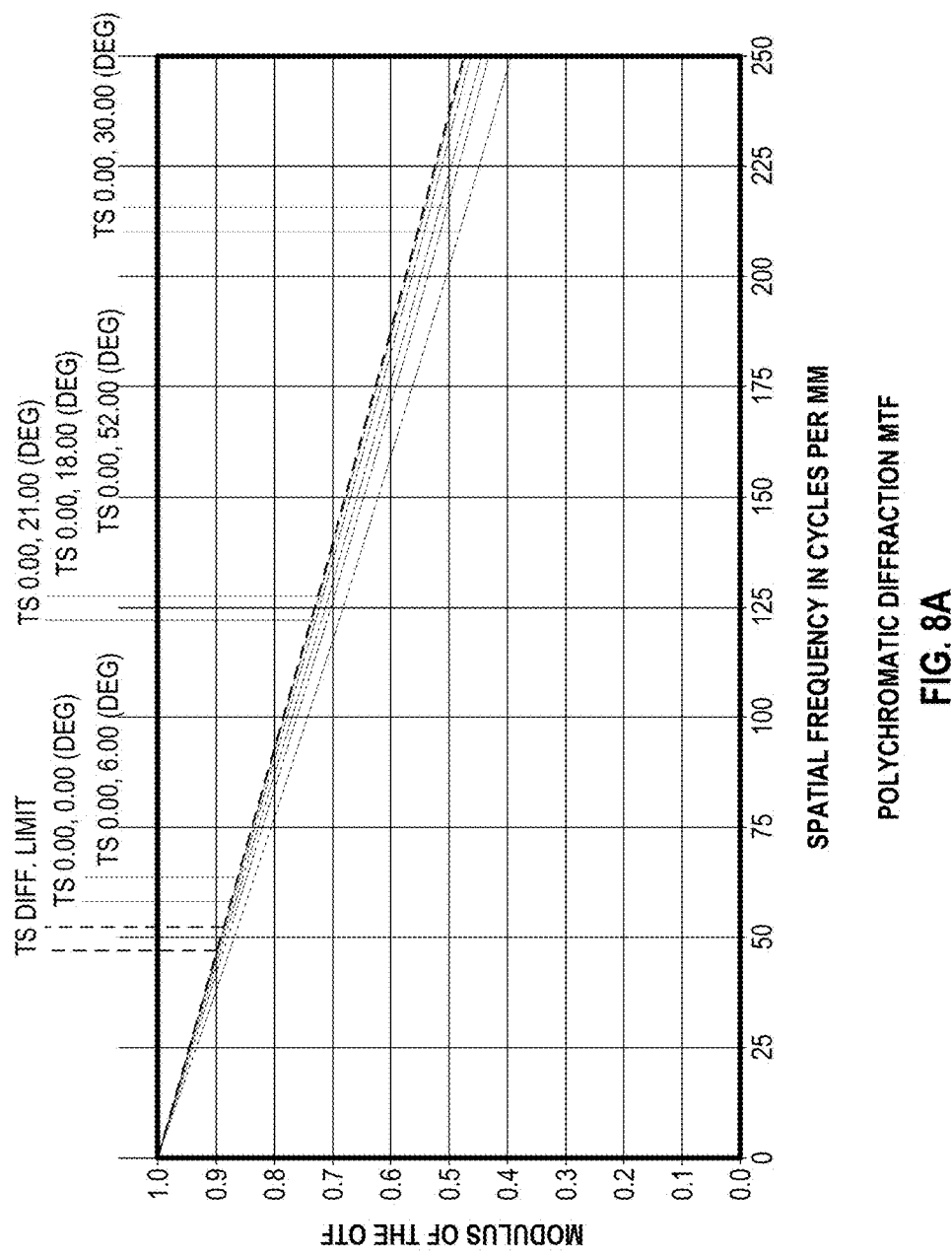
FIG. 8A illustrates diffraction MTF of the wafer-level optical elements of FIGS. 7A-7B.

FIG. 8A illustrates diffraction MTF of the wafer-level optical elements of FIGS. 7A-7B. As illustrated by FIG. 8A in comparison to FIG. 6A, the hybrid plastic/wafer-level-optic design has improved performance compared to the purely wafer-level-optic design.

Figure 8B:
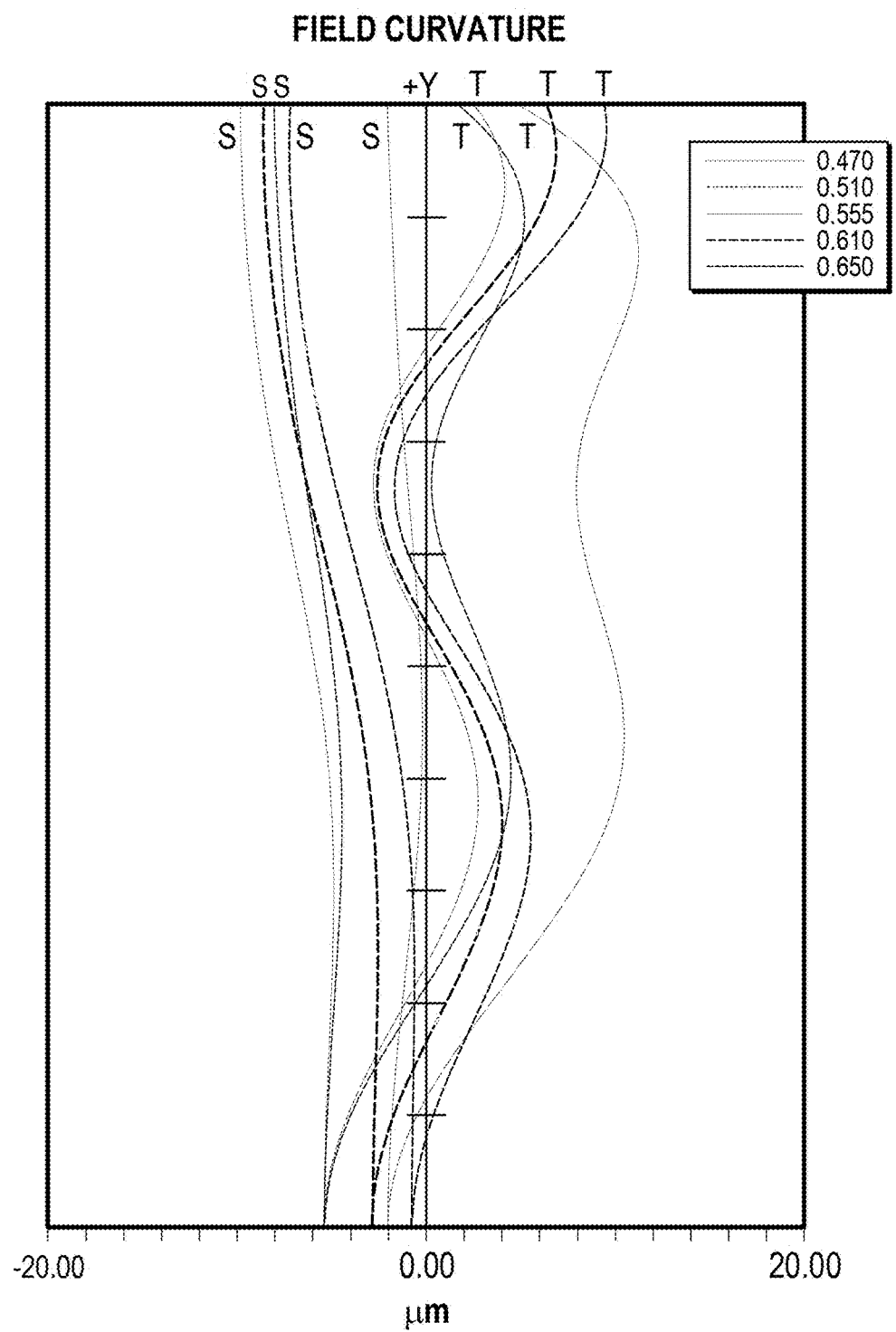
FIGS. 8B and 8C illustrate astigmatic field curves and distortion of the wafer-level optical elements of FIGS. 7A-7B at a number of wavelengths.
Figure 8C:
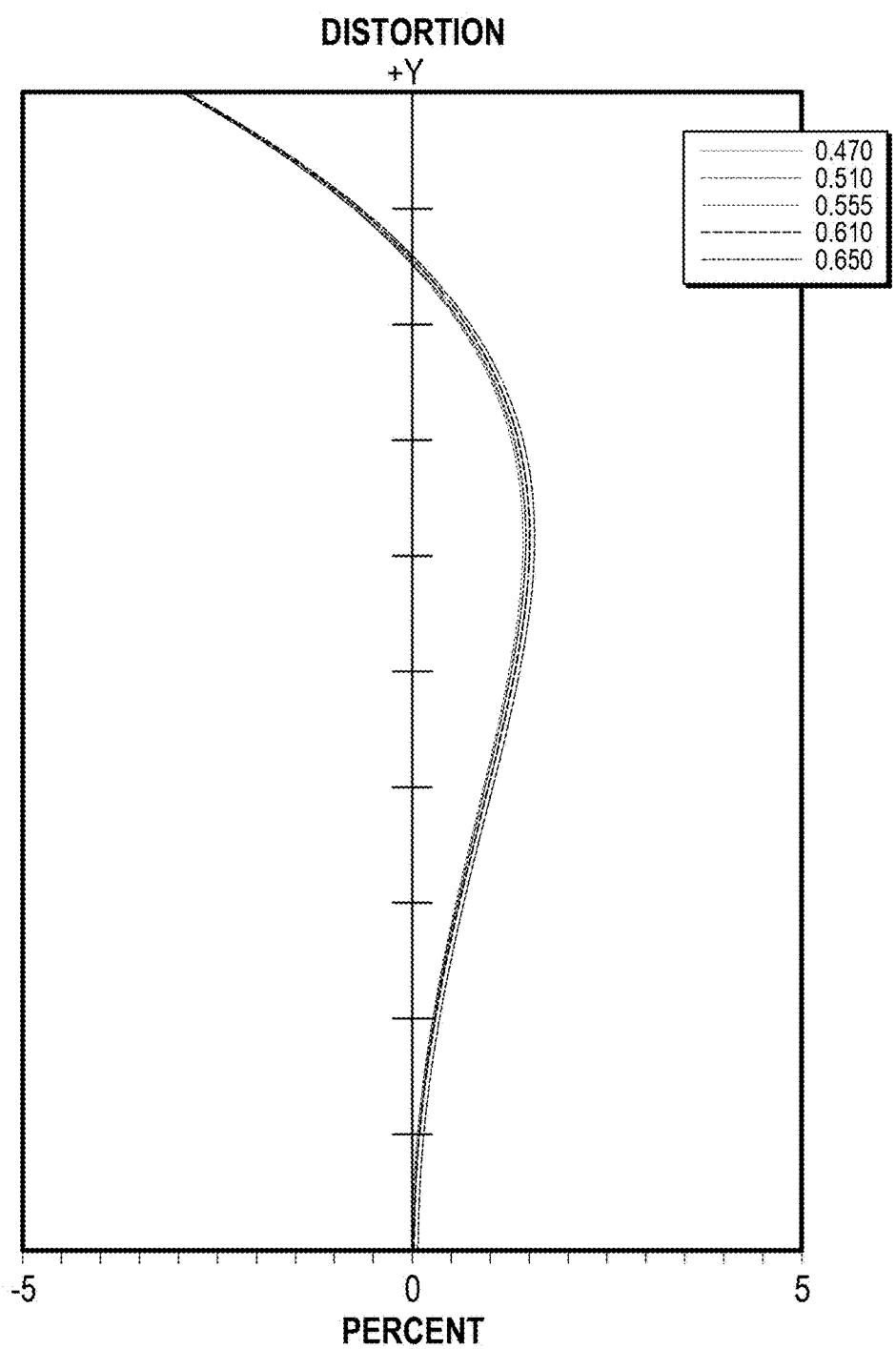

FIGS. 8B and 8C illustrate astigmatic field curves and distortion of the wafer-level optical elements of FIGS. 7A-7B at a number of wavelengths. As shown by FIG. 8B, the design of FIGS. 7A-7B may result in distortions in the captured image data. Rather than increasing the acuity of the optical design, which may increase expense, the disclosed systems can computationally compensate for the known distortion, for example through hardware and/or software implemented on the sensor ASIC.

Overview of Example Image Capture Devices

Figure 9:
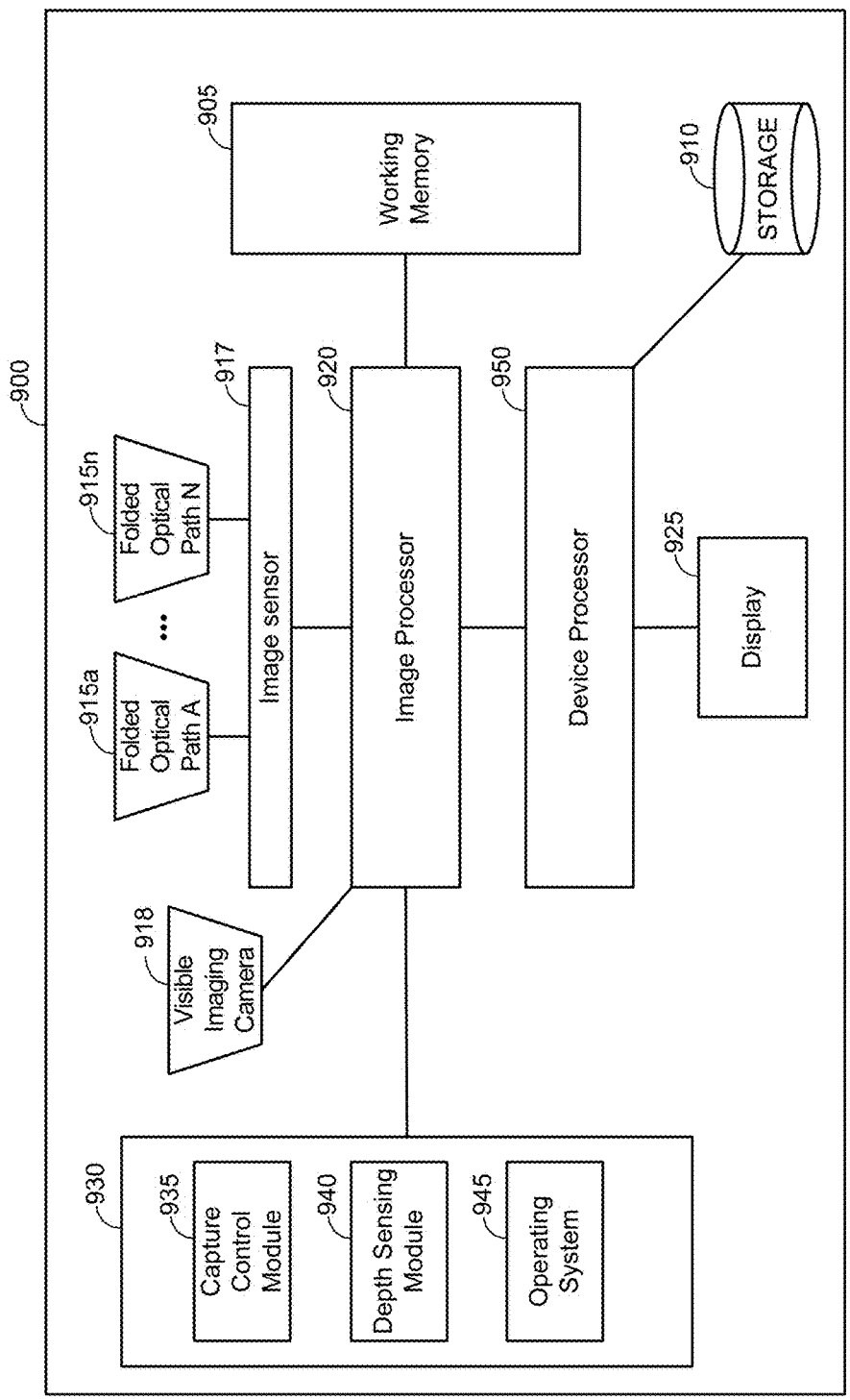
FIG. 9 illustrates a schematic block diagram of an example image capture device implementing a single-sensor folded optic stereoscopic imaging system as described herein.

FIG. 9 illustrates a high-level block diagram of an example image capture device 900 implementing a single-sensor folded optic stereoscopic imaging system as described herein. Image capture device 900 has a set of components including an image processor 920 linked to stereoscopic image sensor 917 having a number of folded optical paths 915a-915n directing stereoscopic images toward different portions of the image sensor 917. The image processor 920 is also in communication with a working memory 905, memory 930, and device processor 950, which in turn is in communication with storage 910 and electronic display 925. In some embodiments the depth map data generated by the stereoscopic image sensor 917 may not be visibly displayed to a user and the electronic display 925 can be optional.

Optionally, in some embodiments of the device 900 a visible imaging camera 918 can also be linked to the image processor 920. The visible imaging camera 918 can provide visible (for example, RGB) images of the same target scene imaged by the stereoscopic image sensor 917. Image processor 920 can be configured to use the depth map data generated by the stereoscopic image sensor 917 and the visible image data from the visible imaging camera 918 together, for example to construct three-dimensional models of imaged objects. In some embodiments the visible imaging camera 918 and folded optical paths 915a-n can be aligned so as to be able to capture image data of the same target scene at the same time. Accordingly, the visible imaging camera 918 can be used to provide a preview image to a user of the target scene, for example for use by the user in manually aligning the field of view of the stereoscopic sensor 917 with the desired target scene. Visible imaging camera 918 may include one or more folded optical paths and corresponding image sensors in order to reduce the height of the visible imaging camera 918. Accordingly, some embodiments of the visible imaging camera 918 can capture multiple images of multiple portions of the target scene that can be stitched together to produce a preview image or a final image of the target scene. In other embodiments the depth map data from the stereoscopic image sensor 917 can be used without visible image data and the visible imaging camera 918 can be omitted.

Device 900 may be a cell phone, digital camera, tablet computer, personal digital assistant, or the like. Some embodiments of device 900 can be incorporated into a vehicle-based imaging system, for example an unmanned aerial vehicle. There are many portable computing devices in which a reduced thickness stereoscopic imaging system such as is described herein would provide advantages. Device 900 may also be a stationary computing device or any device in which a thin stereoscopic imaging system would be advantageous. A plurality of applications may be available to on device 900. These applications may include traditional photographic and video applications, panoramic image generation, stereoscopic imaging such as three-dimensional images and/or three-dimensional video, three-dimensional modeling, and three-dimensional object and/or landscape mapping, to name a few.

The image capture device 900 includes the image sensor 917 and folded optical paths 915a-n for capturing sets of images for producing depth map data. Folded optical paths 915a-n may each comprise a number of lens elements and primary and secondary light folding surfaces for directing light toward a portion of sensor 917, as discussed above. In general, N folded optical paths 915a-n may be used, where N≥2. Thus, N images of the target scene may be captured by the sensor 917 from the viewpoints of the folded optical paths 915a-n. It will be appreciated that multiple sensors can be used in other embodiments. The image sensor 917 may be coupled to the image processor 920 to transmit captured image data to the image processor 920.

The image processor 920 may be configured to perform various processing operations on received image data comprising N stereoscopic images of the target scene in order to output depth information. Examples of image processing operations include cropping, scaling (e.g., to a different resolution), image format conversion, image filtering (e.g., spatial image filtering), lens artifact or defect correction, stereoscopic matching, depth map generation, etc. In some embodiments the image processor 920 can be a chip in a three-dimensional wafer stack including the stereoscopic image sensor 917, for example a RICA processor. In such embodiments the working memory 905 and memory 930 can be incorporated as hardware or software of the RICA processor. In some embodiments, image processor 920 may be a general purpose processing unit or a processor specially designed for imaging applications. Image processor 920 may, in some embodiments, comprise a plurality of processors. Certain embodiments may have a processor dedicated to each image captured and transmitted to the processor 920. Processor 920 may be one or more dedicated image signal processors (ISPs).

As shown, the image processor 920 is connected to a memory 930 and a working memory 905. In the illustrated embodiment, the memory 930 stores capture control module 935, depth sensing module 940, and operating system 945. These modules include instructions that configure the image processor 920 to perform various image processing and device management tasks. Working memory 905 may be used by image processor 920 to store a working set of processor instructions contained in the modules of memory 930. Alternatively, working memory 905 may also be used by image processor 920 to store dynamic data created during the operation of device 900. As discussed above, in some embodiments image processor 920 can be a RICA processor and the working memory 905 and memory 930 can be incorporated as hardware or software of the RICA processor.

As mentioned above, the image processor 920 is configured by several modules stored in the memories. The capture control module 935 may include instructions that configure the image processor 920 to adjust the capture parameters (for example exposure time, focus position, and the like) of the image sensor 917 and optionally the visible imaging camera 918. Capture control module 935 may further include instructions that control the overall image capture functions of the device 900. For example, capture control module 935 may include instructions that call subroutines to configure the image processor 920 to capture raw image data of a target scene using the imaging sensor 917 and folded optical paths 915*a-n*. Capture control module 935 may then call the depth sensing module 940 to perform a stereoscopic matching technique on the N images captured by the sensor 917 and output a depth information representing the target scene to imaging processor 920.

Depth sensing module 940 may comprise instructions that configure the image processor 920 to perform depth sensing techniques on captured image data. For example, the depth sensing module 940 may include instructions that configure the image processor 920 to perform a stereo matching technique on the captured image data. By comparing information about the target scene from images captured from two or more vantage points, the image processor 920 can extract three-dimensional information by examination of the relative positions of objects in the images. Accordingly, the depth sensing module 940 may include instructions that configure the image processor 920 to align the images, identify keypoints or features in the images, identify an amount of disparity between the keypoints or features, and store the disparity as a depth map.

Operating system module 945 configures the image processor 920 to manage the working memory 905 and the processing resources of device 900. For example, operating system module 945 may include device drivers to manage hardware resources such as the image sensors 917, 918. Therefore, in some embodiments, instructions contained in the image processing modules discussed above may not interact with these hardware resources directly, but instead interact through standard subroutines or APIs located in operating system component 970. Instructions within operating system 945 may then interact directly with these hardware components. Operating system module 945 may further configure the image processor 920 to share information with device processor 950.

Device processor 950 may be configured to control the display 925 to display depth information, captured images, or a preview of a captured image to a user. The display 925 may be external to the imaging device 900 or may be part of the imaging device 900. The display 925 may also be configured to provide a view finder displaying a preview image for use prior to capturing an image, or may be configured to display a captured image stored in memory or recently captured by the user. The display 925 may comprise an LCD or LED screen and may implement touch sensitive technologies, for example providing a user interface for controlling device functions.

Device processor 950 or image processor 920 may write data to storage module 910, for example data representing captured images and/or depth information. While storage module 910 is represented graphically as a traditional disk device, those with skill in the art would understand that the storage module 910 may be configured as any storage media device. For example, the storage module 910 may include a disk drive, such as a hard disk drive, optical disk drive or magneto-optical disk drive, or a solid state memory such as a FLASH memory, RAM, ROM, and/or EEPROM. The storage module 910 can also include multiple memory units, and any one of the memory units may be configured to be within the image capture device 900, or may be external to the image capture device 900. For example, the storage module 910 may include a ROM memory containing system program instructions stored within the image capture device 900. The storage module 910 may also include memory cards or high speed memories configured to store captured images which may be removable from the device 900.

Though not illustrated, device 900 may include one or more ports or devices for establishing wired or wireless communications with a network or with another device.

Although FIG. 9 depicts a device having separate components to include a processor, imaging sensor, and memory, one skilled in the art would recognize that these separate components may be combined in a variety of ways to achieve particular design objectives. For example, in some embodiments the memory components may be combined with processor components to save cost and improve performance. Additionally, although FIG. 9 illustrates two memory components, including memory component 930 comprising several modules and a separate memory 905 comprising a working memory, one with skill in the art would recognize several embodiments utilizing different memory architectures. For example, a design may utilize ROM or static RAM memory for the storage of processor instructions implementing the modules contained in memory 930. The processor instructions may be loaded into RAM to facilitate execution by the image processor 920. For example, working memory 905 may comprise RAM memory, with instructions loaded into working memory 905 before execution by the processor 920.

Overview of Example Microlens Shifting

Figure 10A:
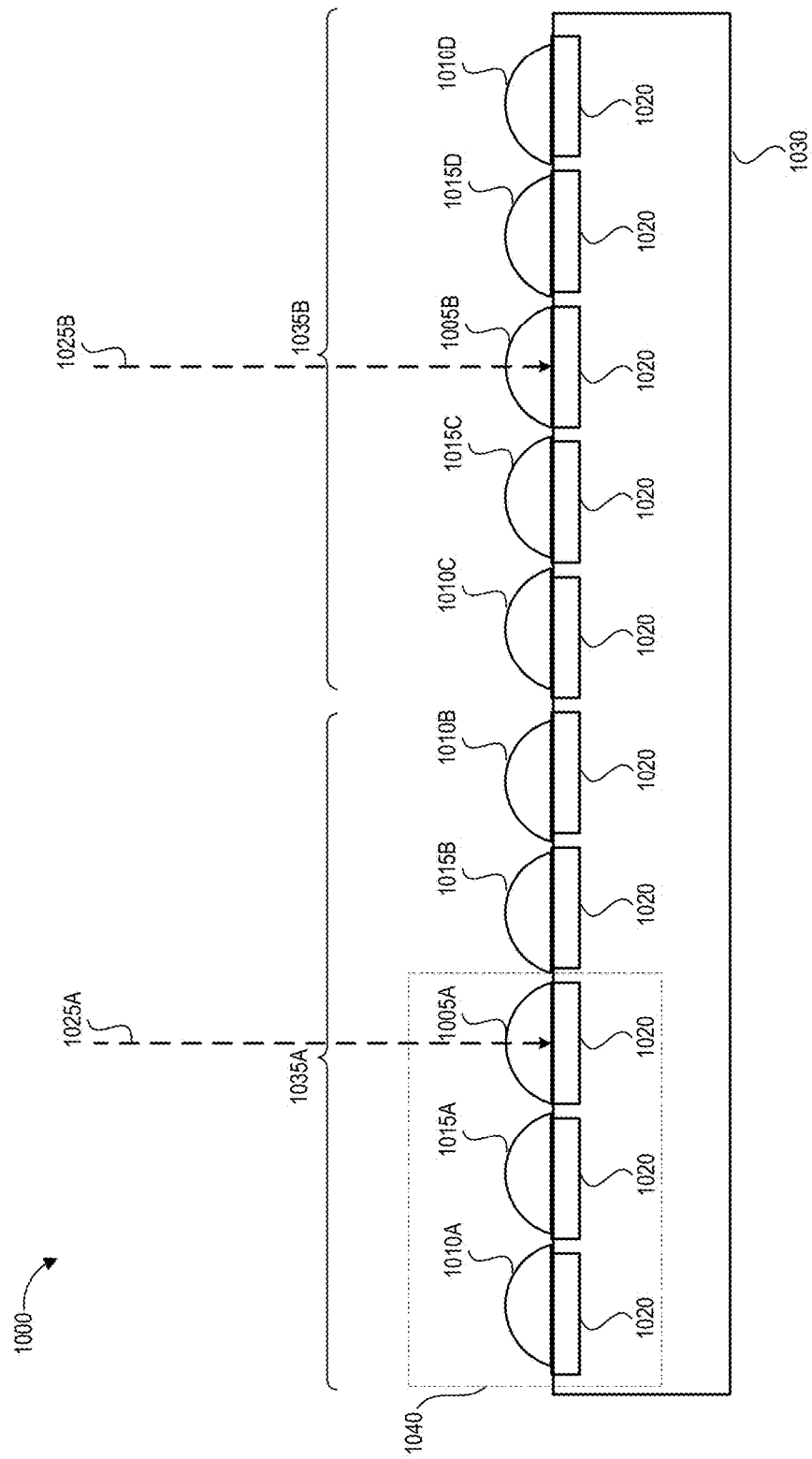
FIGS. 10A and 10B illustrates a schematic diagram of microlens shifting for a portion of a sensor in a single-sensor folded optic stereoscopic imaging system as described herein.

FIG. 10A illustrates a schematic diagram 1000 of microlens shifting for a portion of a sensor 1030 in a single-sensor folded optic stereoscopic imaging system as described herein. The sensor 1030 includes a number of photosensitive elements 1020. Light can propagate toward the sensor 1030 along first and second optical axis 1025A, 1025B, for example from first and second folded optic paths as described herein.

As illustrated in FIG. 10A, a microlens (reference numbers 1005A, 1005B, 1010A-1010D, and 1015A-1015D) can be provided over each photosensitive element 1020 of the sensor 1030. A microlens 1010A-1010D and 1015A-1015D can be shifted relative to the sensor 1030 it is positioned near to account for the angle of light entering one microlens compared to the angle of light entering another microlens, which affects how the light propagates to the sensor 1030. As described above, microlenses can be shifted by an amount that increases proportional to the center of the sensor, where shift refers to the relative positioning of a center of the microlens to a center of the underlying photosensitive element. In a conventional image sensor that captures only a single image, the amount of shift for all microlenses can be determined based on radial distance from the center of image sensor. However, because the disclosed sensor 1030 can capture multiple images, one from the light propagating along first optical axis 1025A and one from the light propagating along second optical axis 1025B, the disclosed microlenses can be grouped into subsets according to the sensor areas used to capture the different images. As illustrated, the microlenses are grouped into a first subset 1035A corresponding to the area of sensor 1030 upon which light is incident after propagating along the first optical path 1025A, as well as a first subset 1035B corresponding to the area of sensor 1030 upon which light is incident after propagating along the second optical path 1025B. The shift for these subsets can be determined based on the center of that portion of the sensor that is used to capture one of the images. This can increase the amount of light captured by the photosensitive elements positioned away from the center of the sensor.

FIG. 10A illustrates centered microlenses 1005A, 1005B that are centered over their respective photosensitive elements 1020. The centered microlenses 1005A, 1005B correspond to the centers of left and right images, respectively. As shown, intermediate microlenses 1015A-1015D on either side of the centered microlenses 1005A, 1005B are shifted by a first amount relative to the underlying photosensitive elements 1020. Outer microlenses 1010A-1010D are shifted by a second amount relative to the underlying photosensitive elements 1020, where the second amount is larger than the first amount.

The depiction of FIG. 10A illustrates two image centers located along optical axes 1025A, 1025B and five photosensitive elements and corresponding microlenses for each image. It will be appreciated that this is a simplification for purposes of explaining the described microlens shift, and that each image may be captured by an array of hundreds or thousands of photosensitive elements having a range of microlens shifts determined, as described above, based on CRA and radial distance from the center of the corresponding portion of the sensor. These principles can be applied to two groupings of microlenses for single sensors capturing two images, to four groupings of microlenses for single sensors capturing four images, and the like.

Figure 10B:
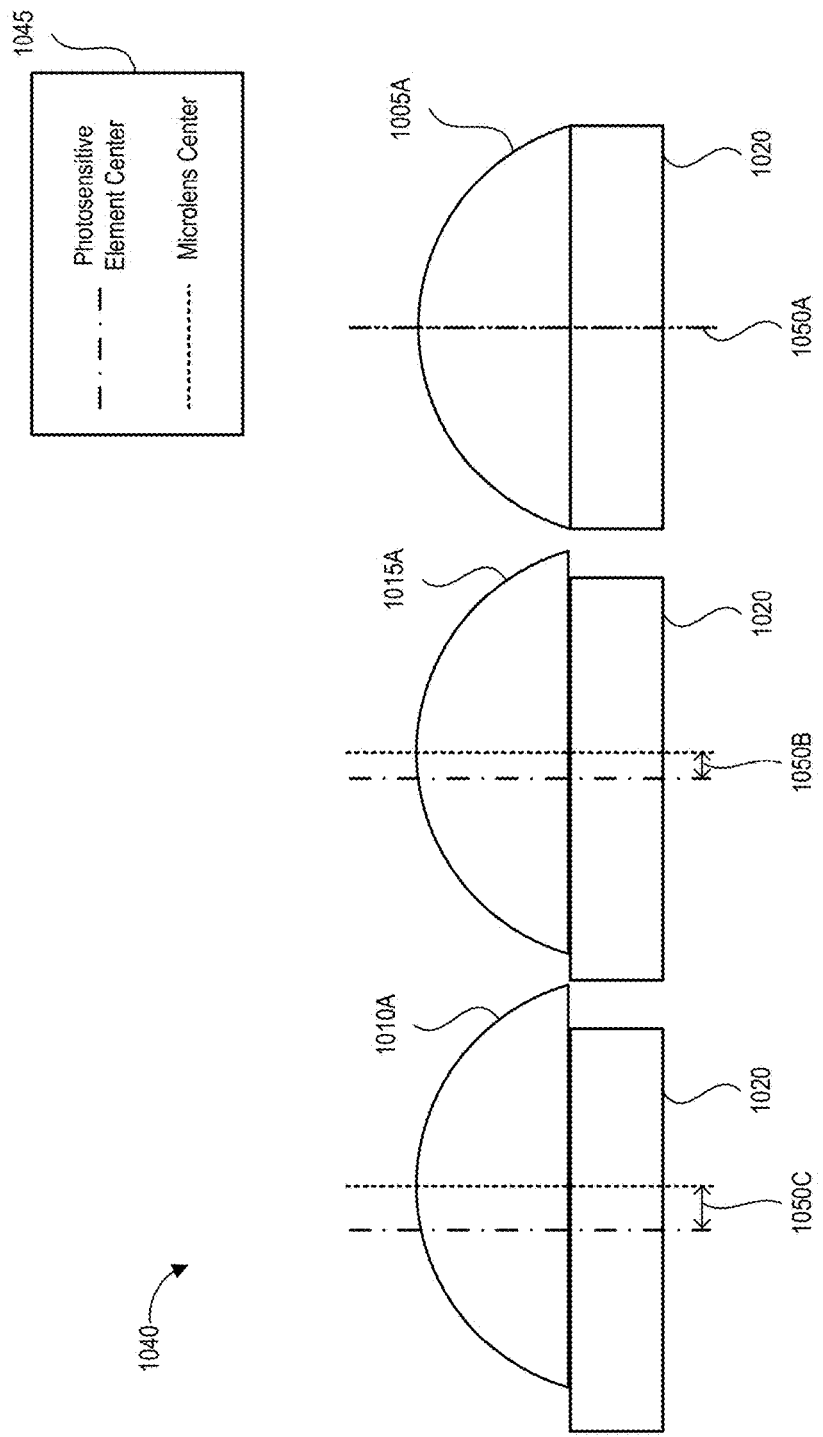

FIG. 10B illustrates an enlarged view of a portion 1040 of the image sensor 1030 including three photosensitive elements 1020 and three microlenses—one centered microlens 1005A, one intermediate microlens 1015A, and one outer microlens 1010A. The legend 1045 shows that the dash-dot-dash lines represent the center of photosensitive elements 1020, while the dotted lines represent the centers of the microlenses.

FIG. 10B illustrates the alignment 1050A between the center of centered microlens 1005A and its corresponding photosensitive element 1020. The center of the intermediate microlens 1015A is offset by a first amount 1050B from the center of its corresponding photosensitive element 1020. The center of the outer microlens 1010A is offset by a second amount 1050C from the center of its corresponding photosensitive element 1020, where the second amount 1050C is larger than the first amount 1050B due to the increased distance from the optical center of this portion of the sensor.

Implementing Systems and Terminology

Implementations disclosed herein provide systems, methods and apparatus for compact stereoscopic imaging systems. One skilled in the art will recognize that these embodiments may be implemented in hardware, software, firmware, or any combination thereof.

In some embodiments, the circuits, processes, and systems discussed above may be utilized in a wireless communication device. The wireless communication device may be a kind of electronic device used to wirelessly communicate with other electronic devices. Examples of wireless communication devices include cellular telephones, smart phones, Personal Digital Assistants (PDAs), e-readers, gaming systems, music players, netbooks, wireless modems, laptop computers, tablet devices, etc.

The wireless communication device may include one or more image sensors, one or more image signal processors, a memory including instructions or modules for carrying out the processes discussed above. The device may also have data, a processor loading instructions and/or data from memory, one or more communication interfaces, one or more input devices, one or more output devices such as a display device and a power source/interface. The wireless communication device may additionally include a transmitter and a receiver. The transmitter and receiver may be jointly referred to as a transceiver. The transceiver may be coupled to one or more antennas for transmitting and/or receiving wireless signals.

The wireless communication device may wirelessly connect to another electronic device (e.g., base station). Examples of wireless communication devices include laptop or desktop computers, cellular phones, smart phones, wireless modems, e-readers, tablet devices, gaming systems, etc. Wireless communication devices may operate in accordance with one or more industry standards such as the 3rd Generation Partnership Project (3GPP). Thus, the general term "wireless communication device" may include wireless communication devices described with varying nomenclatures according to industry standards.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, any of the signal processing algorithms described herein may be implemented in analog circuitry. A computing environment can include any type of computer system, including, but not limited to, a computer system based on a microprocessor, a mainframe computer, a digital signal processor, a portable computing device, a personal organizer, a device controller, and a computational engine within an appliance, to name a few.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

As used herein, the term "plurality" denotes two or more. For example, a plurality of components indicates two or more components. The terms "couple," "coupling," "coupled" or other variations of the word couple as used herein may indicate either an indirect connection or a direct connection. For example, if a first component is "coupled" to a second component, the first component may be either indirectly connected to the second component or directly connected to the second component. The term "coupled" may include communicatively coupled, electrically coupled, magnetically coupled, physically coupled, optically coupled, and combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive electrical signals (digital signals or analog signals) directly or indirectly, such as via one or more wires, buses, networks, etc.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like. The phrase "based on" does not mean "based only on," unless expressly specified otherwise. In other words, the phrase "based on" describes both "based only on" and "based at least on."

The previous description of the disclosed implementations is provided to enable any person skilled in the art to make or use the present invention. Various modifications to these implementations will be readily apparent to those skilled in the art, and the generic principles defined herein may be applied to other implementations without departing from the scope of the invention. Thus, the present invention is not intended to be limited to the implementations shown herein but is to be accorded the widest scope consistent with the principles and novel features disclosed herein.

What is claimed is:

1. A stereoscopic imaging system comprising:
a first set of optics arranged to propagate light along a first path, and a second set of optics arranged to propagate light along a second path, each of the first and second paths having a first optical axis, a second optical axis, and a third optical axis, each of the first and second sets of optics comprising
a first light folding surface positioned to receive light propagating from a scene along the first optical axis and redirect the light along the second optical axis,
a second light folding surface positioned to receive the light propagating along the second optical axis and redirect the light along the third optical axis, and
a plurality of lens elements positioned along at least the first and second optical axis, the plurality of lens elements including a first subset having inverted telescopic optical characteristics and a second subset lengthening a length of the first or second path; and
an image sensor having a first region positioned to receive light propagating along the third optical axis of the first set of optics and having a second region positioned to receive light propagating along the third optical axis of the second set of optics.

2. The stereoscopic imaging system of claim 1, wherein the light propagating along the third optical axis of the first set of optics and the light propagating along the third optical axis of the second set of optics are simultaneously incident upon the image sensor.

3. The stereoscopic imaging system of claim 1, wherein the first region of the image sensor does not overlap with the second region of the image sensor.

4. The stereoscopic imaging system of claim 1, wherein the first optical axis of the first set of optics is separated from the first optical axis of the second set of optics by a distance of 2-5 cm.

5. The stereoscopic imaging system of claim 1, further comprising a processor configured to generate a first stereoscopic image from signals received from the first region of the image sensor and a second stereoscopic image from signals received from the second region of the image sensor.

6. The stereoscopic imaging system of claim 5, wherein the processor is further configured to generate depth information based on the first and second stereoscopic images.

7. The stereoscopic imaging system of claim 5, wherein the image sensor comprises a first wafer having an array of photosensitive elements and row scanning circuitry, and wherein the processor comprises a second wafer having column readout circuitry, timing control circuitry, and a reconfigurable instruction cell array image signal processor.

8. The stereoscopic imaging system of claim 5, further comprising at least one silicon via connecting the first wafer with the second wafer.

9. The stereoscopic imaging system of claim 6, wherein the first wafer comprises a backside illuminated CMOS wafer.

10. The stereoscopic imaging system of claim 1, wherein the image sensor comprises a plurality of photosensitive elements, a first subset of the plurality of photosensitive elements positioned in the first region and a second subset of the plurality of photosensitive elements positioned in the second region.

11. The stereoscopic imaging system of claim 8, further comprising a plurality of microlenses each positioned over a corresponding one of the plurality of photosensitive elements, a first subset of the plurality of microlenses positioned over the first subset of the plurality of photosensitive elements in the first region of the image sensor and a second subset of the plurality of microlenses positioned over the second plurality of photosensitive elements in the second region of the image sensor.

12. The stereoscopic imaging system of claim 9, wherein:
a center of each of the plurality of microlenses is shifted by a predetermined shift amount relative to a center of the corresponding one of the plurality of photosensitive elements;
the predetermined shift amount of the first subset of the plurality of microlenses is determined based on a radial distance from a center of the first subset of the plurality of photosensitive elements; and
the predetermined shift amount of the second subset of the plurality of microlenses determined is based on a radial distance from a center of the second subset of the plurality of photosensitive elements.

13. The stereoscopic imaging system of claim 1, further comprising a housing having an upper surface and a lower surface spaced apart from the upper surface, wherein the first and second sets of optics and the image sensor are positioned between the upper surface and the lower surface.

14. The stereoscopic imaging system of claim 13, wherein the upper surface of the housing includes a first aperture positioned to pass light from the scene to the first set of optics and a second aperture positioned to pass light from the scene to the second set of optics.

15. The stereoscopic imaging system of claim 13, wherein a center of the first aperture is positioned a distance of 2-5 cm from a center of the second aperture.

16. The stereoscopic imaging system of claim 1, wherein the first subset comprises a concave lens positioned along the first optical axis and a convex lens positioned along the second optical axis.

17. The stereoscopic imaging system of claim 1, wherein each folded optic path comprises:
first and second prisms each comprising one of the first and second light folding surfaces;
a first lens having a first lens surface and a second lens surface positioned along the first optical axis; and
a group of lenses positioned along second optical axis between an output surface of the first prism and an input surface of the second prism, the group of lenses including a second lens having a third lens surface and a fourth lens surface, the third lens surface positioned to receive light from the output surface of the first prism,
wherein the first lens and the second lens comprise the first subset having telescopic optical characteristics.

18. The stereoscopic imaging system of claim 1, wherein each folded optic path comprises:
first and second reflective mirrors each comprising one of the first and second light folding surfaces;
a first lens having a first lens surface and a second lens surface positioned along the first optical axis; and
a group of lenses positioned along second optical axis between the first and second reflective mirrors, the group of lenses including a second lens having a third lens surface and a fourth lens surface, the third lens surface positioned to receive light from the first reflective mirror,
wherein the first lens and the second lens comprise the first subset having telescopic optical characteristics.

19. The stereoscopic imaging system of claim 1, wherein each of the first and second sets of optics comprises:
first and second reflective mirrors each comprising one of the first and second light folding surfaces;
a first wafer-level optical stack positioned along the first optical axis;
a second wafer-level optical stack positioned along the second optical axis to receive light from the first reflective mirror, the first and second lens wafer-level optical stacks comprising the first subset having inverted telescopic optical characteristics; and
at least one wafer-level optical stack positioned along the second optical axis to receive light passed through the second wafer-level optical stack.

20. The stereoscopic imaging system of claim 19, further comprising:
a stop positioned along the second optical axis, the stop comprising an aperture;
a first wafer-level optical stack positioned between the second lens surface and the stop, the stop positioned to receive light propagating from the first wafer-level optical stack that at least a portion of the received light passes through the aperture; and
at least a second wafer-level optical stack positioned to receive the portion of the light passed through the aperture.

21. The stereoscopic imaging system of claim 1, wherein each of the first and second sets of optics comprises:
a prism comprising an input surface, the first light folding surface, and an output surface;
a first lens of the plurality of lens elements having a first lens surface and an opposing surface coupled to the input surface;
a second lens of the plurality of lens elements having a second lens surface and an opposing surface coupled to the output surface, the first and second lenses comprising the first subset having telescopic optical characteristics; and
at least one wafer-level optical stack positioned along the second optical axis.

22. The stereoscopic imaging system of claim 21, further comprising:
a stop positioned along the second optical axis, the stop comprising an aperture;

a first wafer-level optical stack positioned between the second lens surface and the stop, the stop positioned to receive light propagating from the first wafer-level optical stack that at least a portion of the received light passes through the aperture; and at least a second wafer-level optical stack positioned to receive the portion of the light passed through the aperture.

23. An image capture apparatus comprising:

first and second optical path folding means comprising
first light folding means positioned to receive light propagating from a scene along a first optical axis and redirect the light along a second optical axis,
second light folding means positioned to receive the light propagating along the second optical axis and redirect the light along a third optical axis, and
a plurality of light focusing means positioned along at least the first and second optical axis, the plurality of light focusing means including a first subset having inverted telescopic optical characteristics and a second subset lengthening a length of the first or second path; and
image sensing means having a first region positioned to receive light propagating along the third optical axis of the first set of optics and having a second region positioned to receive light propagating along the third optical axis of the second set of optics.

24. The image capture apparatus of claim 23, further comprising means for generating depth information based on the first and second stereoscopic images.

25. The image capture apparatus of claim 23, further comprising stop means positioned along the second optical axis, the stop means positioned to receive the light output from the first subset of the light focusing means and pass a portion of the light through the stop means.

26. The image capture apparatus of claim 23, wherein the image capture means comprises a single sensor wafer having a first region and a second region that do not overlap, wherein the first region receives light propagating along the third optical axis of the first optical path folding means, and wherein the second region receives light propagating along the third optical axis of the second optical path folding means.

27. An image capture method comprising:

via both a first set of optics and a second set of optics:
receiving light propagating along a first optical axis from a scene by a first light folding surface,
focusing the light via a first lens group positioned at least along the first optical axis, the first lens group having inverted telescopic optical properties;
redirecting the light, via the first light folding surface, from the first optical axis to a second optical axis passing through the output surface;
redirecting the light, via a second light folding surface, along a third optical axis; and
receiving the light propagating along the third optical axis of each of the first and second sets of optics by an image sensor.

28. The image capture method of claim 27, wherein the receiving comprises simultaneously receiving, upon a surface of the image sensor, the light propagating along the third optical axis of the first set of optics and the light propagating along the third optical axis of the second set of optics.

29. The image capture method of claim 27, wherein the receiving comprises:

receiving the light propagating along the third optical axis of the first set of optics at a first region of the image sensor; and
receiving the light propagating along the third optical axis of the second set of optics at a second region of the image sensor.

30. The image capture method of claim 29, further comprising reading out signals from the first region of the image sensor and the second region of the image sensor in parallel.

* * * * *